(12) United States Patent
Lee et al.

(10) Patent No.: US 10,158,017 B2
(45) Date of Patent: Dec. 18, 2018

(54) SEMICONDUCTOR STRUCTURE AND METHOD FOR SEMICONDUCTOR DEVICE FABRICATION WITH IMPROVED SOURCE DRAIN EPITAXY

(71) Applicant: Taiwan Semiconductor Manufacturing Co., Ltd., Hsin-Chu (TW)

(72) Inventors: Wei-Yang Lee, Taipei (TW); Tzu-Hsiang Hsu, Hsinchu County (TW); Ting-Yeh Chen, Hsinchu (TW); Feng-Cheng Yang, Hsinchu County (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/684,088

(22) Filed: Aug. 23, 2017

(65) Prior Publication Data

US 2017/0373189 A1    Dec. 28, 2017

Related U.S. Application Data

(63) Continuation of application No. 15/187,976, filed on Jun. 21, 2016, now Pat. No. 9,748,389.

(Continued)

(51) Int. Cl.
*H01L 21/00* (2006.01)
*H01L 27/00* (2006.01)
(Continued)

(52) U.S. Cl.
CPC ........ *H01L 29/7848* (2013.01); *H01L 21/845* (2013.01); *H01L 27/1104* (2013.01);
(Continued)

(58) Field of Classification Search
CPC .......... H01L 21/845; H01L 21/823871; H01L 21/823475; H01L 27/1116; H01L 27/1104;
(Continued)

(56) References Cited

U.S. PATENT DOCUMENTS 4,737,829 A    4/1988  Morimoto et al.
7,667,271 B2   2/2010  Yu et al.
(Continued)

FOREIGN PATENT DOCUMENTS

KR    20140107073    9/2014
KR    20150089044    8/2015
(Continued)

*Primary Examiner* — Nikolay Yushin
(74) *Attorney, Agent, or Firm* — Haynes and Boone, LLP

(57) ABSTRACT

A semiconductor structure includes a substrate, first gate structures and second gate structures over the substrate, third epitaxial semiconductor features proximate the first gate structures, and fourth epitaxial semiconductor features proximate the second gate structures. The first gate structures have a greater pitch than the second gate structures. The third and fourth epitaxial semiconductor features are at least partially embedded in the substrate. A first proximity of the third epitaxial semiconductor features to the respective first gate structures is smaller than a second proximity of the fourth epitaxial semiconductor features to the respective second gate structures. In an embodiment, a first depth of the third epitaxial semiconductor features embedded into the substrate is greater than a second depth of the fourth epitaxial semiconductor features embedded into the substrate.

20 Claims, 23 Drawing Sheets

Related U.S. Application Data

(60) Provisional application No. 62/313,430, filed on Mar. 25, 2016.

(51) Int. Cl.
| | | |
|---|---|---|
| *H01L 29/00* | (2006.01) | |
| *H01L 29/78* | (2006.01) | |
| *H01L 21/84* | (2006.01) | |
| *H01L 27/11* | (2006.01) | |
| *H01L 29/08* | (2006.01) | |
| *H01L 29/16* | (2006.01) | |
| *H01L 29/161* | (2006.01) | |
| *H01L 29/165* | (2006.01) | |
| *H01L 29/66* | (2006.01) | |

(52) U.S. Cl.
CPC ...... *H01L 27/1116* (2013.01); *H01L 29/0847* (2013.01); *H01L 29/161* (2013.01); *H01L 29/165* (2013.01); *H01L 29/1608* (2013.01); *H01L 29/66636* (2013.01); *H01L 29/66795* (2013.01); *H01L 29/7851* (2013.01)

(58) Field of Classification Search
CPC ......... H01L 27/11807; H01L 29/66795; H01L 29/66636; H01L 29/7851; H01L 29/1651; H01L 29/1608; H01L 29/161; H01L 29/0847; H01L 29/7848
See application file for complete search history.

(56) References Cited

U.S. PATENT DOCUMENTS

| | | | |
|---|---|---|---|
| 8,362,575 B2 | 1/2013 | Kwok et al. | |
| 8,367,498 B2 | 2/2013 | Chang et al. | |
| 8,440,517 B2 | 5/2013 | Lin et al. | |
| 8,497,528 B2 | 7/2013 | Lee et al. | |
| 8,575,672 B2 | 11/2013 | Song et al. | |
| 8,610,240 B2 | 12/2013 | Lee et al. | |
| 8,680,576 B2 | 3/2014 | Ching et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,785,285 B2 | 7/2014 | Tsai et al. | |
| 8,796,759 B2 | 8/2014 | Perng et al. | |
| 8,809,139 B2 | 8/2014 | Huang et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 9,009,641 B2 * | 4/2015 | Becker | H01L 27/092 716/118 |
| 2011/0068407 A1 | 3/2011 | Yeh et al. | |
| 2011/0256682 A1 * | 10/2011 | Yu | H01L 21/02181 438/287 |
| 2013/0011983 A1 | 1/2013 | Tsai et al. | |
| 2013/0126978 A1 * | 5/2013 | Becker | H01L 27/092 257/369 |
| 2014/0239404 A1 | 8/2014 | Huang et al. | |
| 2014/0252412 A1 | 9/2014 | Tsai et al. | |
| 2015/0311091 A1 | 10/2015 | Jiang | |
| 2015/0318211 A1 | 11/2015 | Guo et al. | |
| 2015/0333075 A1 | 11/2015 | Yang et al. | |
| 2015/0372107 A1 | 12/2015 | Liu et al. | |

FOREIGN PATENT DOCUMENTS

| | | |
|---|---|---|
| KR | 20150133012 | 11/2015 |
| TW | 201434078 | 9/2014 |
| TW | 201546961 | 12/2015 |

* cited by examiner

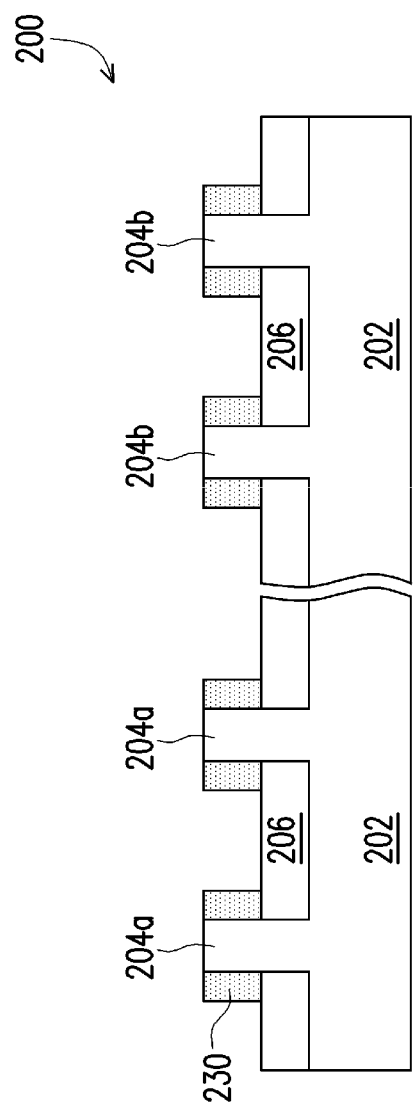

US 10,158,017 B2

SEMICONDUCTOR STRUCTURE AND METHOD FOR SEMICONDUCTOR DEVICE FABRICATION WITH IMPROVED SOURCE DRAIN EPITAXY

PRIORITY

This is a continuation of U.S. application Ser. No. 15/187,976, filed Jun. 21, 2016, which claims the benefits of U.S. Prov. App. Ser. No. 62/313,430, filed Mar. 25, 2016 and entitled "Method for Semiconductor Device Fabrication with Improved Source Drain Epitaxy," the entire disclosure of which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as semiconductor devices, such as metal-oxide-semiconductor field effect transistors (MOSFETs), are scaled down through various technology nodes, strained source/drain features (e.g., stressor regions) have been implemented using epitaxial (epi) semiconductor materials to enhance carrier mobility and improve device performance. Forming a MOSFET with stressor regions often epitaxially grows silicon (Si) to form raised source and drain (S/D) features for an n-type device, and epitaxially grows silicon germanium (SiGe) to form raised S/D features for a p-type device. Various techniques directed at shapes, configurations, and materials of these S/D features have been implemented to further improve transistor device performance. Although existing approaches have been generally adequate for their intended purposes, they have not been entirely satisfactory in all respects. For example, in a device having memory devices and logic devices, transistor densities are generally higher in the memory device region than in the logic device region, imposing different requirements on the raised S/D features in the two regions and creating challenges in growing the raised S/D features in both regions simultaneously.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3, 4A, 4B, 5, 6, 7, 8, 9, 10A, 10B, 11, 12, 13, 14 illustrate cross-sectional views of the semiconductor structure of FIG. 2A, in portion, at various fabrication stages according to the method of FIGS. 1A and 1B, in accordance with some embodiments.

DETAILED DESCRIPTION

Figure 1A:
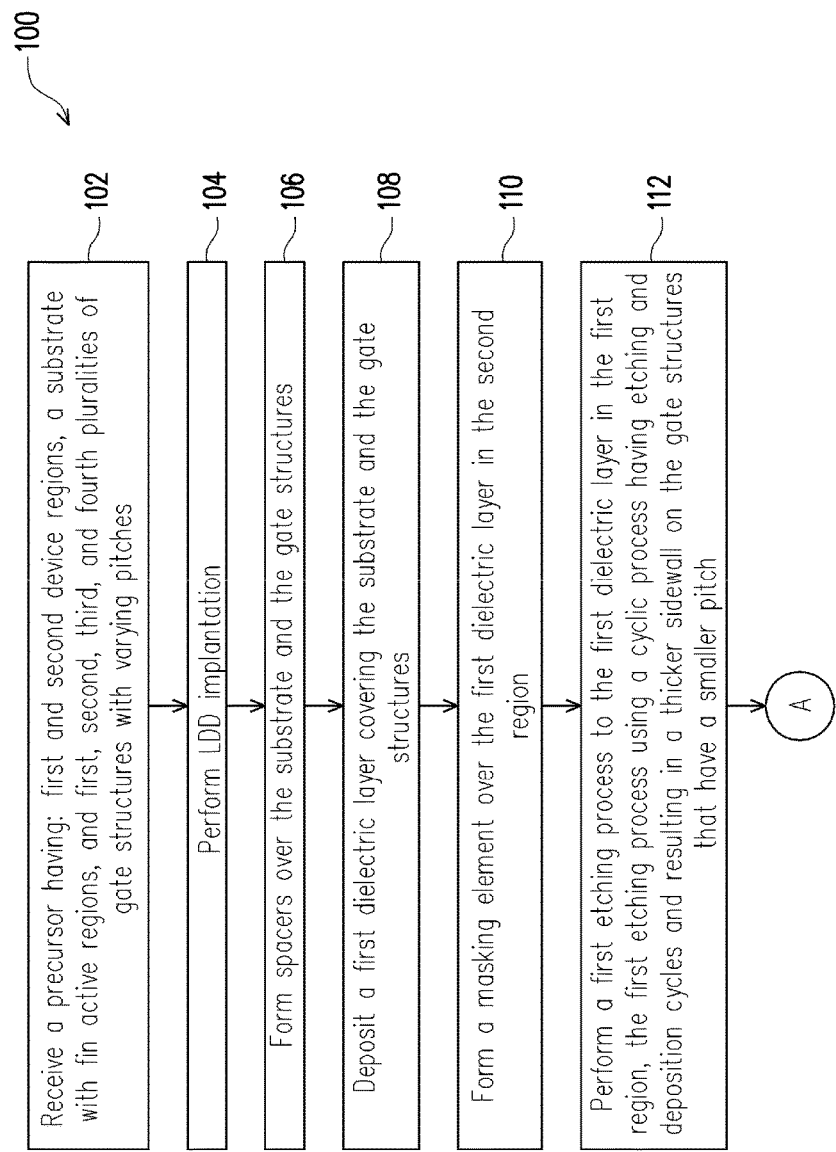
FIGS. 1A and 1B show a block diagram of a method of forming a semiconductor device, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods for semiconductor device fabrication, and more particularly to methods of forming field effect transistors (FETs) having raised epitaxial S/D features in memory devices (e.g., SRAM cells) and logic devices such as input/output (I/O) devices and logic gates including AND, OR, NOR, and inverters. Generally, memory devices and logic devices are in separate regions of an IC. Further, memory devices generally have a higher transistor density (i.e., smaller transistor pitch) than logic devices, for providing increased memory capacity of the IC. This creates some challenges for forming the raised S/D features in both types of devices at the same time. On the one hand, the S/D features in the logic devices are desired to have a large volume so as to stress or strain the devices' channel regions for improved carrier mobility. On the other hand, the S/D features in the memory devices, if grown too tall, might merge where separate S/D features are desired. Methods that fulfill requirements for both the memory devices and logic devices simultaneously are desired for their improved production efficiency, which are the object of the present disclosure.

Figure 1B:
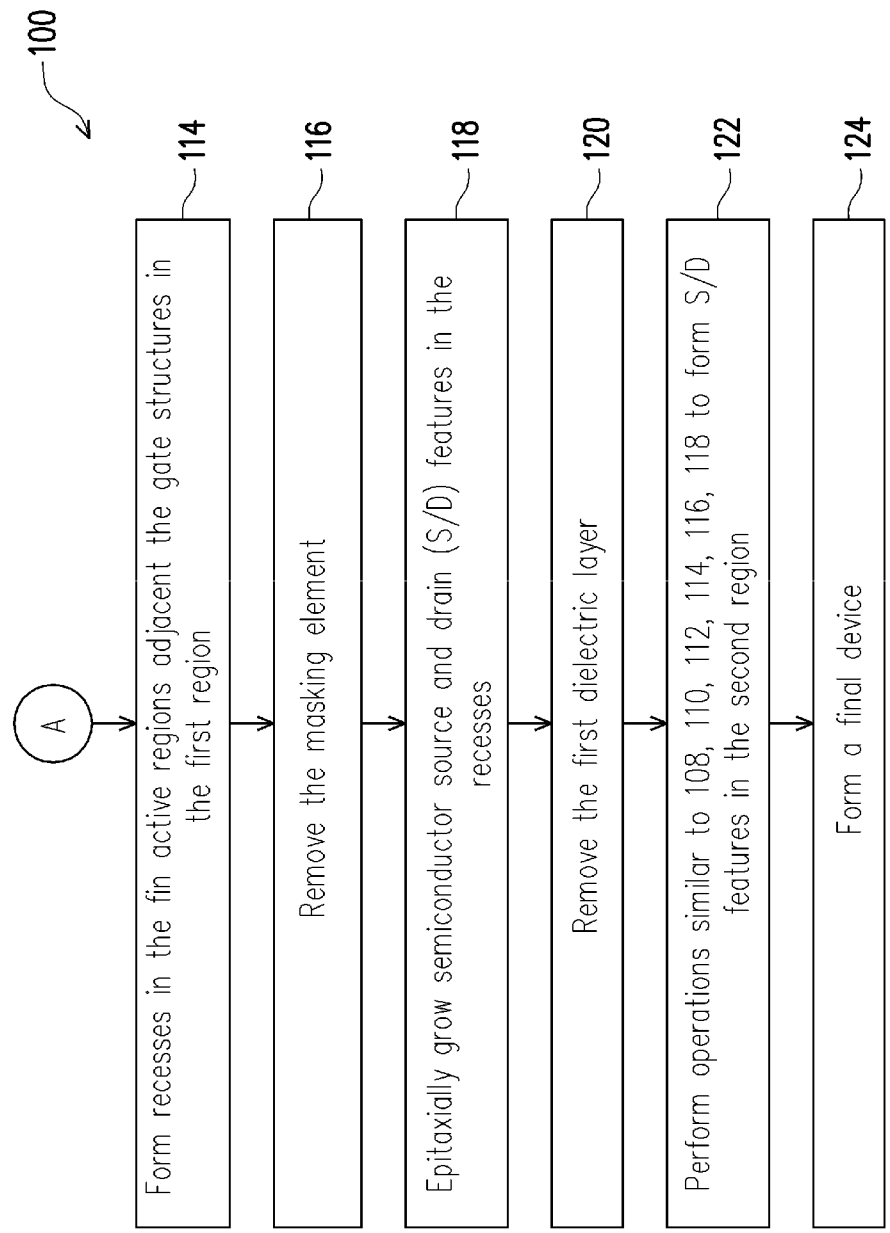

Referring to FIGS. 1A and 1B, shown therein is a method 100 of forming a semiconductor device according to various aspects of the present disclosure. The method 100 is an example, and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 2A-14 which are different views of a semiconductor structure 200 according to various aspects of the present disclosure.

As will be shown, the semiconductor structure 200 illustrates various FinFETs in two device regions of a substrate: a first device region for forming p-type FinFETs and a second device region for forming n-type FinFETs. Further, the various FinFETs include FinFETs for memory devices and FinFETs for logic devices in each of the first and second device regions. The number and types of the device regions and the number and types of FinFETs are provided for simplification and ease of understanding and do not necessarily limit the embodiments to any types of devices, any number of devices, any number of regions, or any configuration of structures of regions. For example, the same inventive concept can be applied in fabricating planar FET devices. Furthermore, the semiconductor structure 200 may be an intermediate device fabricated during processing of an IC, or a portion thereof, that may comprise static random access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Figure 2A:
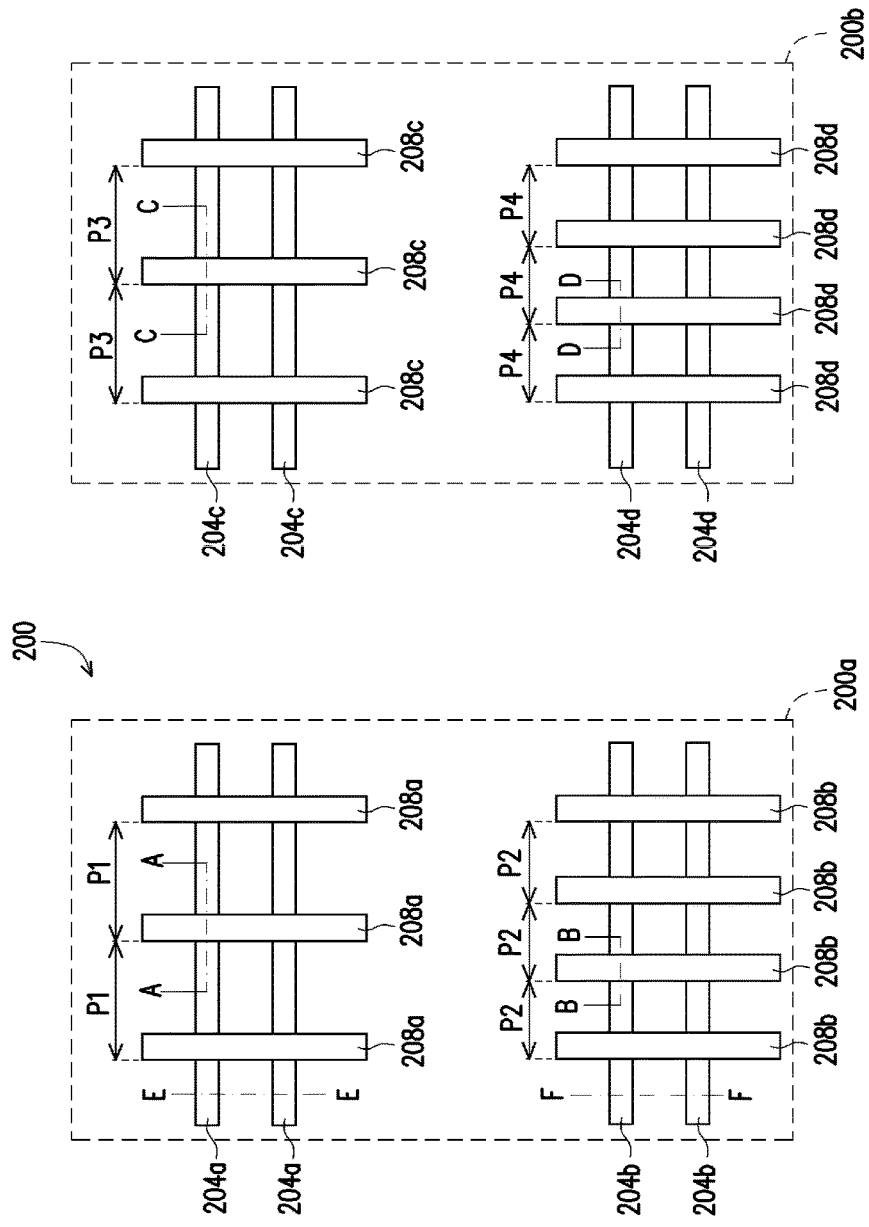
FIG. 2A illustrates a top view of a portion of a semiconductor structure at a fabrication stage according to the method of FIGS. 1A and 1B, in accordance with some embodiments.

Referring to FIG. 1A, at operation 102, the method 100 receives or is provided with a precursor of the semiconductor structure 200. For the convenience of discussion, the precursor is also referred to as the semiconductor structure 200. Referring to FIG. 2A, in a top view, the semiconductor structure 200 includes a first device region 200a and a second device region 200b. The first device region 200a includes various fin active regions (or fins) 204a and 204b (two shown for each), and the second device region 200b includes various fin active regions (or fins) 204c and 204d (two shown for each). In an embodiment, the fins 204a and 204b are suitable for forming p-type FinFETs, and the fins 204c and 204d are suitable for forming n-type FinFETs. In another embodiment, the fins 204a and 204b are suitable for forming n-type FinFETs, and the fins 204c and 204d are suitable for forming p-type FinFETs. The semiconductor structure 200 further includes various gate structures 208a, 208b, 208c, and 208d. The gate structures 208a-d may have different pitches. A pitch is a distance from a gate structure to an adjacent gate structure. A pitch may be defined as from an edge of a gate structure to a corresponding edge of the adjacent gate structure (such as shown in FIG. 2A) or from a center line of a gate structure to the corresponding center line of an adjacent structure (not shown). Particularly, the gate structures 208a engage the fins 204a and have a first pitch P1, and the gate structures 208b engage the fins 204b and have a second pitch P2. In the present embodiment, P1 is greater than P2. In an embodiment, the gate structures 208a (or their derivatives) and the fins 204a collectively form FinFETs for one or more logic devices, while the gate structures 208b (or their derivatives) and the fins 204b collectively form FinFETs for one or more memory devices. Similarly, the gate structures 208c engage the fins 204c and have a third pitch P3, and the gate structures 208d engage the fins 204d and have a fourth pitch P4. In the present embodiment, P3 is greater than P4. In an embodiment, the gate structures 208c (or their derivatives) and the fins 204c collectively form FinFETs for one or more logic devices, while the gate structures 208d (or their derivatives) and the fins 204d collectively form FinFETs for one or more memory devices.

Figure 2B:
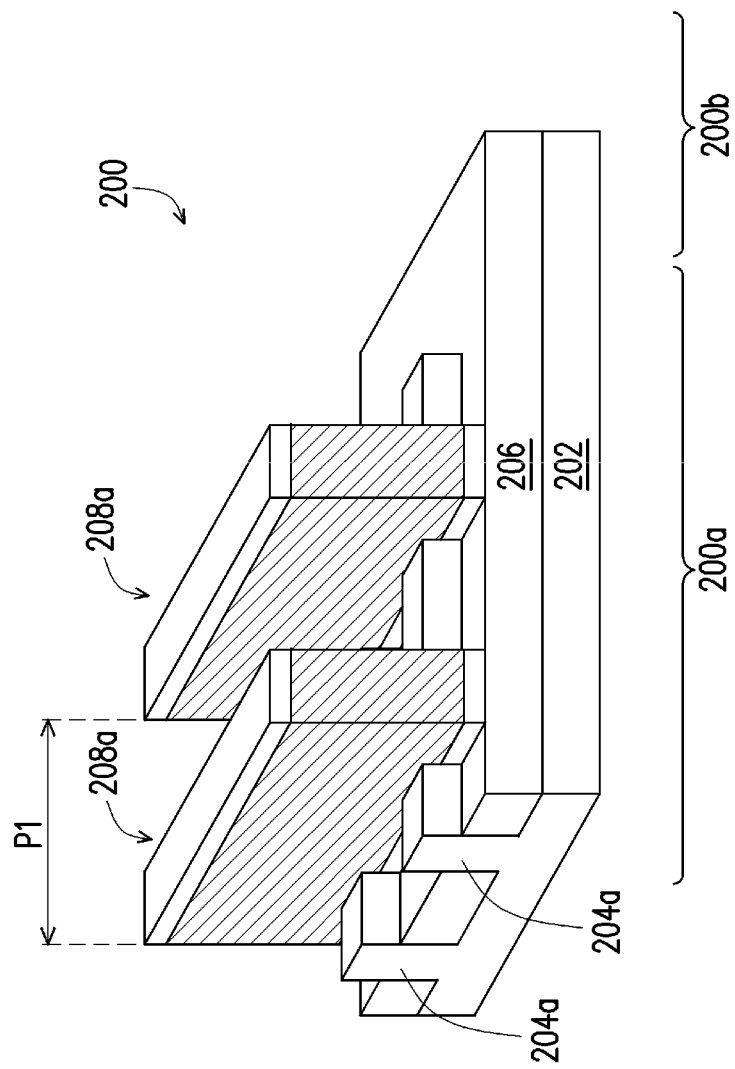
FIG. 2B illustrates a perspective views of the semiconductor structure of FIG. 2A, in portion, in accordance with some embodiments.

Referring to FIG. 2B, shown therein is a perspective view of the semiconductor structure 200, in portion, showing two gate structures 208a over two fins 204a in the device region 200a. The semiconductor structure 200 includes a substrate 202 that extends in both the device regions 200a and 200b, and an isolation structure 206 over the substrate 202. The fins 204a (and the other fins 204b-d, although not shown here) extend upwardly from the substrate 202 and through the isolation structure 206. The substrate 202 is a silicon substrate in the present embodiment. Alternatively, the substrate 202 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 202 is a semiconductor-on-insulator (SOI), such as a semiconductor substrate having a buried dielectric layer on which the fins 204a-d stand. The isolation structure 206 may include silicon oxide, silicon nitride, silicon oxynitride, fluoride-doped silicate glass (FSG), a low-k dielectric material, air gap, and/or other suitable insulating material. The isolation structure 206 may be a shallow-trench-isolation (STI), field oxide, and/or other suitable structures. The isolation structure 206 may include a multi-layer structure, for example, having one or more thermal oxide liner layers.

The fins 204a-d may be fabricated using a suitable procedure that includes photolithography and etch processes. In some embodiments, the fins 204a-d are formed by a procedure that includes forming shallow trench isolation (STI) features 206; and epitaxially growing a semiconductor material to form the fins 204a-d. In some embodiments, the fins 204a-d are formed by a procedure that includes forming shallow trench isolation (STI) features 206 and recessing the STI features 206 to form the fins 204a-d. In some examples, the formation of the STI features 206 includes a photolithography process to form a patterned resist layer; etching an underlying hard mask through the openings of the patterned resist layer; etching the substrate 202 through the openings of the mask to form trenches in the substrate 202; filling in the trenches with one or more dielectric material; and performing a chemical mechanical polishing (CMP) process to form the STI features 206. The photolithography process may include forming a photoresist (resist) layer over the substrate 202; exposing the resist layer to a pattern, performing post-exposure baking; and developing the resist layer to form the patterned resist layer. In various examples, the etching process can include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 204a-d on the substrate 202 may be suitable.

Figure 2C:
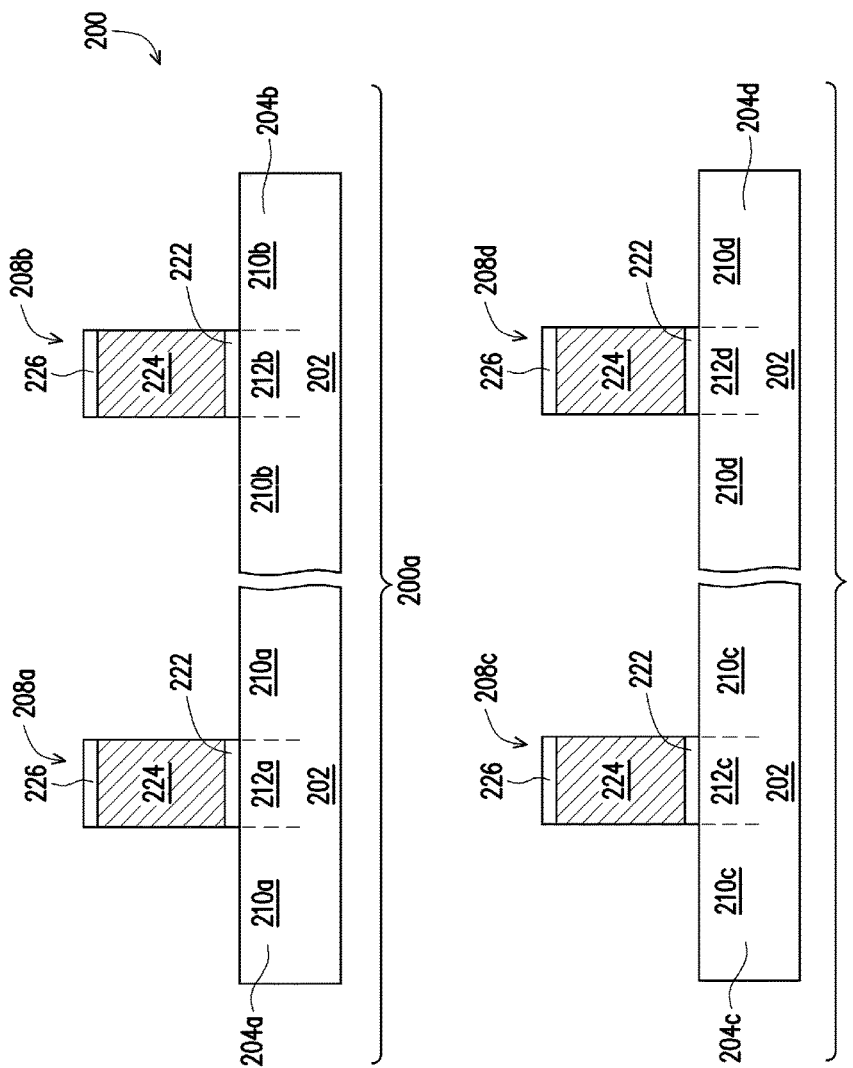
FIGS. 2C and 2D illustrate cross-sectional views of the semiconductor structure of FIG. 2A, in portion, in accordance with some embodiments.
Figure 2D:
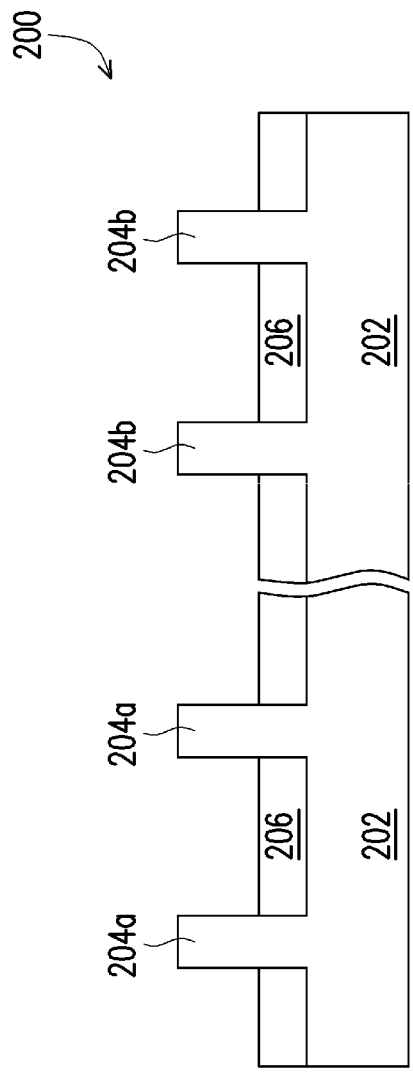

FIG. 2C shows cross-sectional view of the semiconductor structure 200 along the "AA," "BB," "CC," and "DD" lines of FIG. 2A, while FIG. 2D shows cross-sectional view of the semiconductor structure 200 along the "EE" and "FF" lines of FIG. 2A. Referring to FIGS. 2C and 2D collectively, the fins 204a, 204b, 204c, and 204d include source and drain (S/D) regions 210a, 210b, 210c, and 210d and channel regions 212a, 212b, 212c, and 212d, respectively. The gate structures 208a-d are disposed over the channel regions 212a-d, respectively. Each of the gate structures 208a-d may include a gate dielectric layer 222, a gate electrode layer 224, and a hard mask layer 226. The gate structures 208a-d may include one or more additional layers. In an embodiment, the gate electrode layer 224 includes polysilicon. In the present embodiment, the gate structures 208a-d are sacrificial gate structures, i.e., placeholder for final gate stacks.

The gate dielectric layer 222 may include a dielectric material such as silicon oxide, and may be formed by chemical oxidation, thermal oxidation, atomic layer deposition (ALD), chemical vapor deposition (CVD), and/or other suitable methods. The gate electrode layer 224 may include a single layer or multilayer structure. In an embodiment, the gate electrode layer 224 includes polycrystalline silicon (polysilicon) or amorphous silicon. The gate electrode layer 224 may be formed by suitable deposition processes such as low-pressure chemical vapor deposition (LPCVD) and plasma-enhanced CVD (PECVD). In some embodiment, the hard mask layer 226 is a layer of silicon nitride or silicon oxide. In some examples, the hard mask layer 226 may include two or more films, such as a silicon oxide film and a silicon nitride film. The hard mask layer 226 may be formed by deposition and etching processes similar to those forming the gate dielectric layer 222 and the gate electrode layer 224. In an embodiment, the layers 222, 224, and 226 are first deposited as blanket layers over the substrate 202 having the fin active regions 204a-d. Then the blanket layers are patterned through a process including photolithography processes and etching processes thereby removing portions of the blanket layers and keeping the remaining portions over the substrate 202 as the layers 222, 224, and 226.

Figure 3:
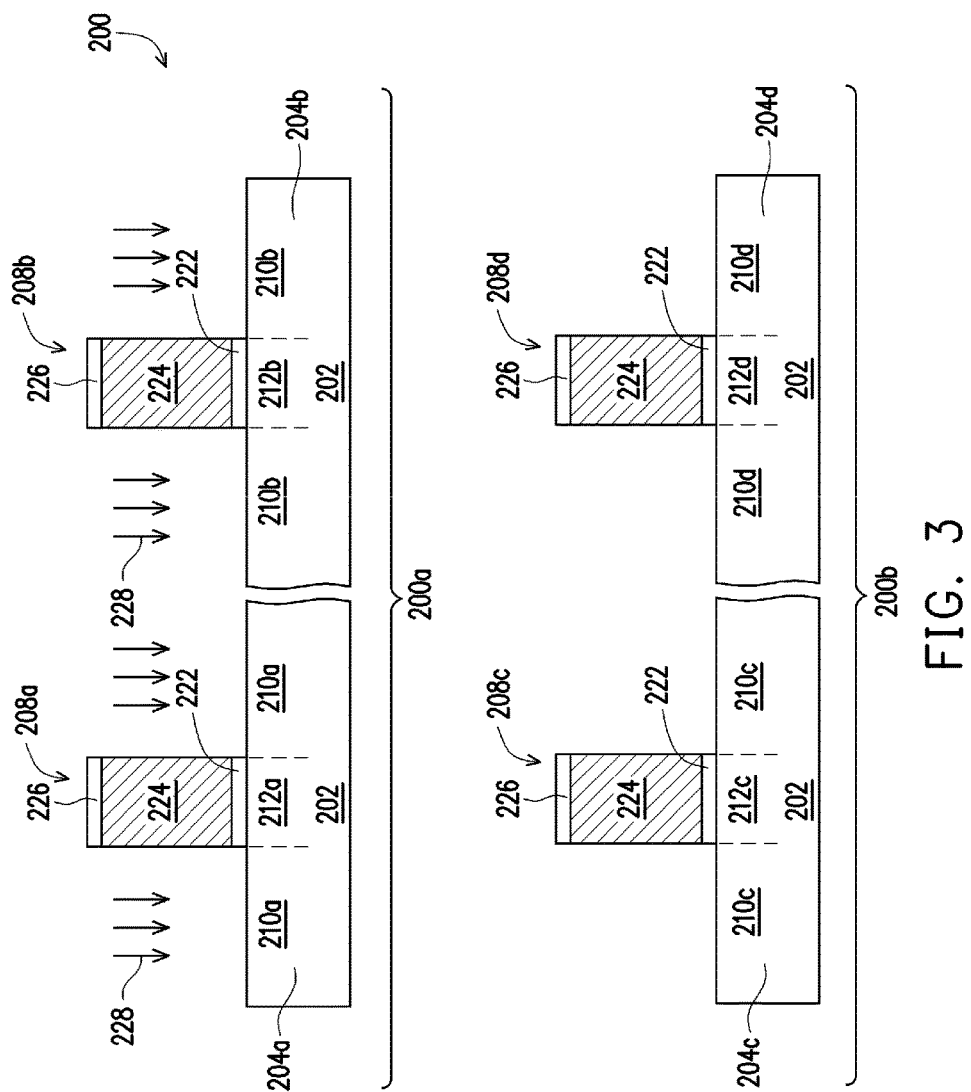

At operation 104, the method 100 (FIG. 1A) performs lightly doped source/drain (LDD) ion implantation 228. Referring to FIG. 3, the ion implantation 228 is performed to form LDD regions in the substrate 202. The LDD implantation process 228 may utilize n-type dopants, such as phosphorus (P) or arsenic (As), for the NFETs, or p-type dopants, such as boron (B) or indium (In), for the PFETs. For example, operation 104 may implant n-type dopant(s) into the region 200a and p-type dopant(s) into the region 200b, or vice versa. The LDD regions are self-aligned with the gate structures 208a-b. A mask layer (not shown) may be used to cover the region 200b when the region 200a is subject to the ion implantation process 228. In some embodiments, the mask layer is a patterned photoresist. In some embodiments, the mask layer is a patterned hard mask of a material, such as silicon oxide, silicon nitride, silicon oxynitride or a combination thereof. The mask layer is removed after the LDD implantation has completed in the region 200a. Similarly, although not shown, the operation 104 performs ion implantation in the region 200b while a mask layer covers the region 200a. The mask layer is removed after the LDD implantation has completed in the region 200b.

Figure 4A:
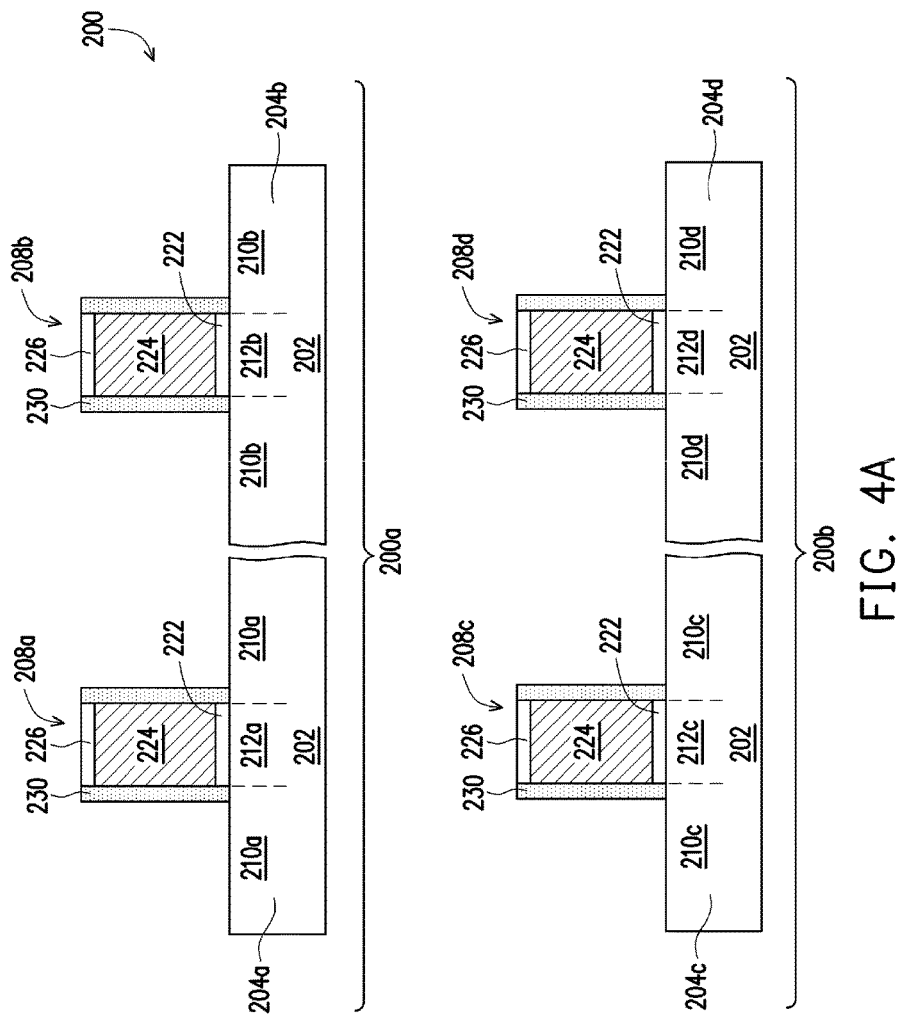

At operation 106, the method 100 (FIG. 1A) forms spacers 230 over the substrate 202 and on sidewalls of the gate structures 208a-d and the fin active regions 204a-d. Referring to FIG. 4A, the spacers 230 are formed on sidewalls of the gate structures 208a-d. Referring to FIG. 4B, the spacers 230 are formed on sidewalls of the fin active regions 204a-b. Although not shown, the spacers 230 are also formed on sidewalls of the fin active regions 204c-d. The spacers 230 on the sidewalls of the fin active regions 204a-d are also referred to as fin sidewall (FSW) spacers 230, while the spacers 230 on the sidewalls of the gate structures 208a-d are also referred to as gate sidewall (GSW) spacers 230. The spacers 230 include a dielectric material, such as silicon oxide, silicon nitride, silicon oxynitride, silicon carbon nitride, a low-k nitride, or a combination thereof. The spacers 230 may include multiple films, such as a silicon oxide film and a silicon nitride film. In an embodiment, the spacers 230 have a thickness in a range from about 2 to about 10 nm. The formation of the spacers 230 may include deposition and anisotropic etch. In some examples, the deposition may include CVD, ALD, or other suitable methods. In some examples, the anisotropic etch may include a dry etch, such as a plasma etch with a bias and a suitable etchant, such as $CF_4$, $SF_6$, $NF_3$, $CH_2F_2$ or a combination thereof. In an embodiment, the FSW spacers 230 are optional, i.e., they may be removed by one or more selective etching process.

Figure 5:
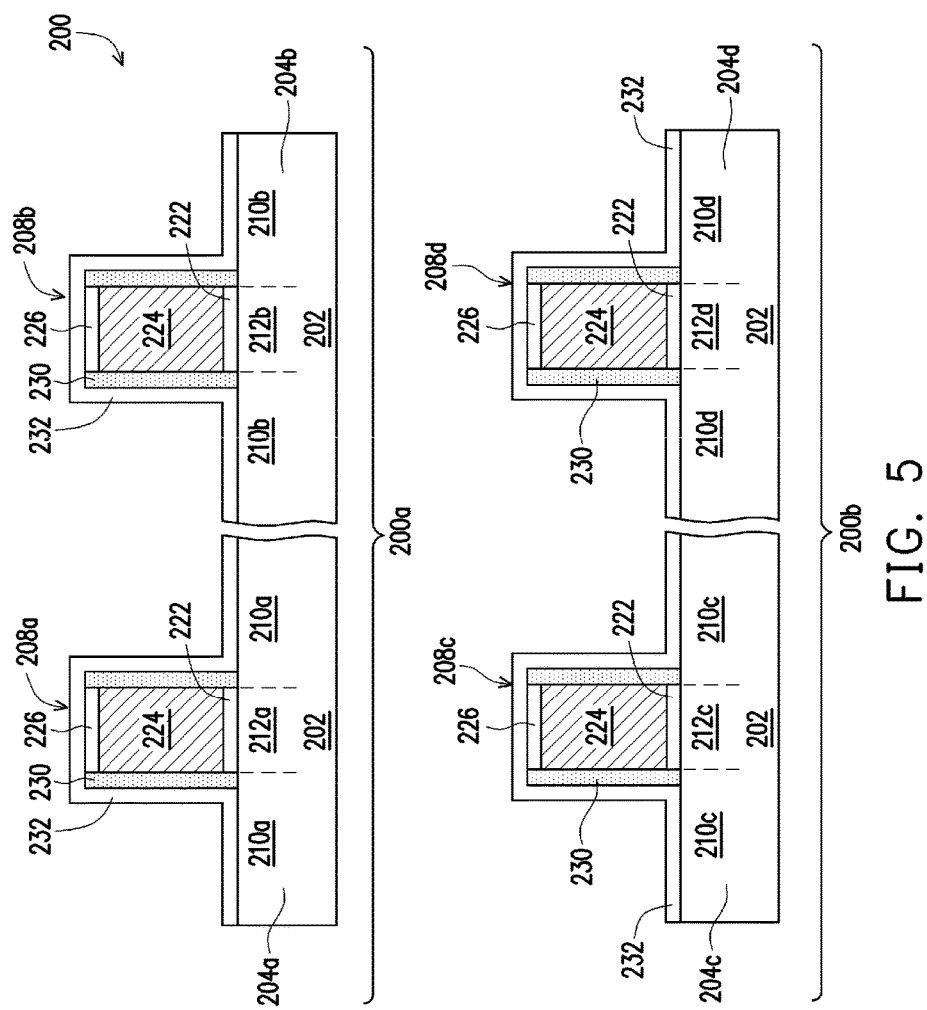

At operation 108, the method 100 (FIG. 1A) deposits a first dielectric layer 232 covering the substrate 202, the isolation structure 206, and the gate structures 208a-d. Referring to FIG. 5, the first dielectric layer 232 is deposited over the top surfaces of the substrate 202 and the gate structures 208a-d, and over the sidewalls of the fin active regions 204a-d and the gate structures 208a-d. Particularly, the first dielectric layer 232 is deposited over both regions 200a and 200b. In an embodiment, the first dielectric layer 232 includes a nitride, such as silicon nitride or silicon oxynitride. The first dielectric layer 232 may be deposited as a conformal layer, i.e., having a substantially uniform thickness as a blanket over the various structures. Alternatively, the thickness of the first dielectric layer 232 may be non-uniform. In some embodiments, the thickness of the first dielectric layer 232 is in a range from about 2 nm to about 10 nm, such as about 4 nm. As will be shown later, the thickness of the first dielectric layer 232 on the sidewalls of the gate structure 208a-d affects proximity of S/D epitaxy to the channel regions 212a-d. The first dielectric layer 232 may be deposited using CVD, ALD, or other suitable methods.

Figure 6:
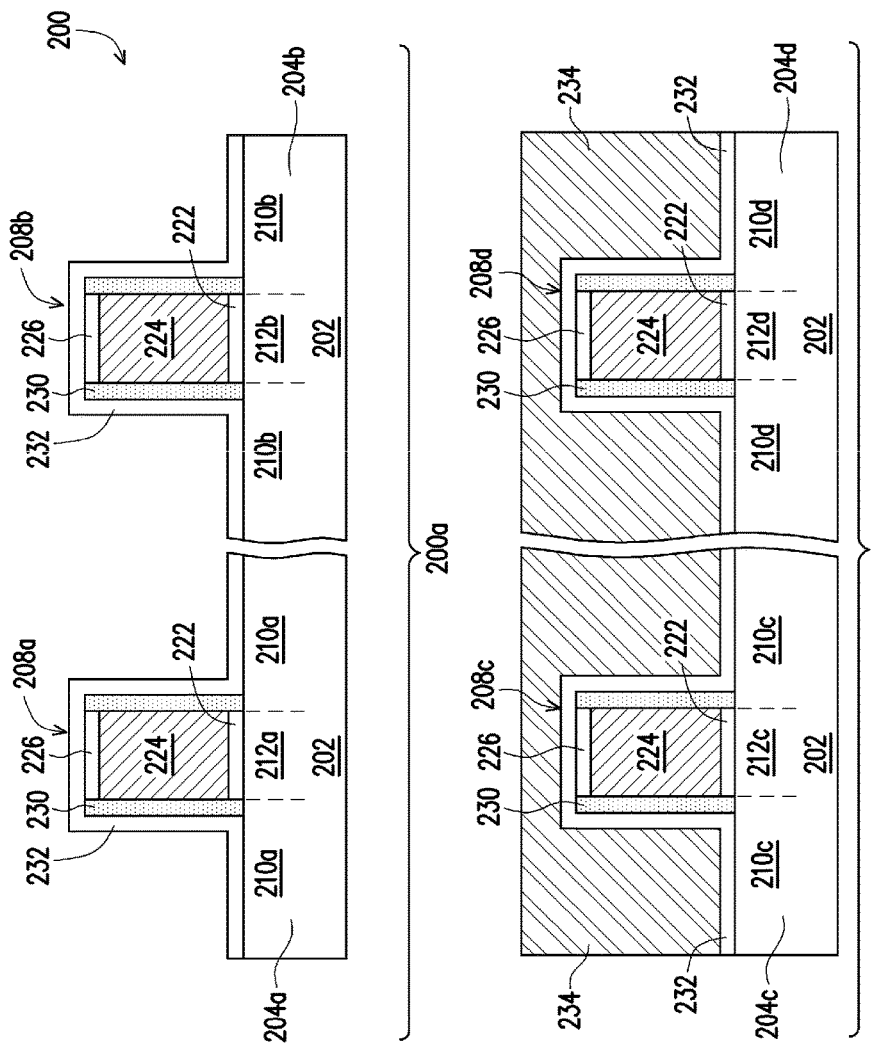

At operation 110, the method 100 (FIG. 1A) forms a masking element 234 over the region 200b. Referring to FIG. 6, the mask element 234 is deposited over the various structures in the region 200b, while exposing the first dielectric layer 232 in the region 200a. In an embodiment, the masking element 234 is a patterned resist and is formed by a process including spin-on coating a resist over the device 200, soft baking the resist, exposing the resist to a pattern, performing post-exposure bake processes, and developing the resist to form the masking element 234 including the resist.

Figure 7:
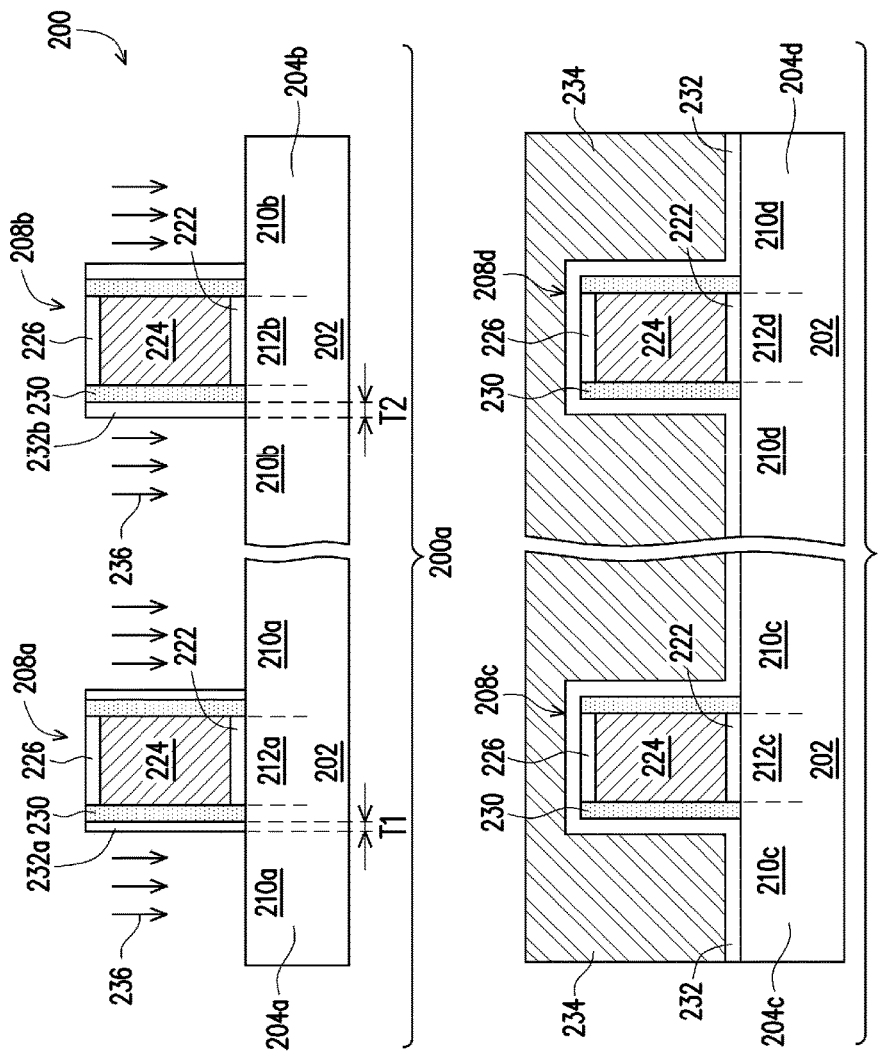

At operation 112, the method 100 (FIG. 1A) performs an etching process 236 to the first dielectric layer 232 in the region 200a while the masking element 234 protects the first dielectric layer 232 in the region 200b. Referring to FIG. 7, the etching process 236 removes the first dielectric layer 232 from the top surfaces of the substrate 202 and the gate structures 208a-d, while leaving a vertical portion 232a and 232b of the first dielectric layer 232 on the sidewalls of the gate structures 208a and 208b, respectively. In an embodiment, the etching process 236 is selective to the material(s) of the first dielectric layer 232. In another word, while etching the first dielectric layer 232, the etching process 236 does not etch (or insignificantly etches) the hard mask layer 226 and the substrate 202. In an embodiment, the etching process 236 is an anisotropic dry etching process that is properly biased to provide a much faster etching rate vertically than laterally.

As discussed with respect to FIG. 2A, the device density is different in memory device regions and in logic device regions in the semiconductor structure 200. The memory device regions generally have a higher device density than the logic device regions. For example, the gate pitch P2 is smaller than the gate pitch P1 in FIG. 2A. Although not shown, the fin pitches (distance from one fin active region to an adjacent fin active region) may also be different in the two regions, with the fin pitch in the memory device regions being smaller than in the logic device regions. The different device density, coupled with the topography of the fin active regions 204a-b and the gate structures 208a-b, create loading effects to the etching process 236. In another word, the etching process 236 may remove the first dielectric layer 232 with slightly different etching rates in the memory device region and in the logic device region. In the present disclosure, the etching process 236 is tuned to have different lateral etching rates to the first dielectric layer 232 while completely removing the first dielectric layer 232 from the top surface of the substrate 202. A net effect is that the first dielectric layers 232a and 232b have different thicknesses, T1 and T2, respectively. The benefits of such tuning will become evident in a later section of the present disclosure.

In an embodiment, the etching process 236 includes a cyclic process having repetitions of an etching cycle and a deposition cycle. For example, it may perform an etching cycle followed by a deposition cycle, and repeats the etching and deposition cycles. During the etching cycle, it introduces an etchant gas such as a gas containing fluorine, chlorine, oxygen, bromine, or iodine for removing the first dielectric layer 232. During the deposition cycle, it introduces a deposition gas such as a carbon-containing gas for forming some polymeric material over the surface of the semiconductor structure 200. The polymeric material deposited during the deposition cycle(s) generally covers both the top surface (horizontal portion) and the sidewalls (vertical portion) of the first dielectric layer 232. The portion of the polymeric material deposited over the sidewalls of the first dielectric layer 232 temporally protects the vertical portions of the first dielectric layer 232 from the next etching cycle. The portion of the polymeric material deposited over the top surface of the first dielectric layer 232 does not provide as much protection to the horizontal portion of the first dielectric layer 232 because the etching is vertically oriented and the polymeric material does not provide much etch resistance. The inventors of the present disclosure have discovered that by tuning the parameters of the etching cycles and the deposition cycles, the etching process 236 can be controlled to produce different thicknesses T1 and T2. In the present embodiment, the etching process 236 is tuned to result in T1 being less than T2. The parameters to be tuned include, but not limited to, the chemistry of the etching gas and the deposition gas as well as the flow rates thereof, etching pressure, etching cycle duration, deposition cycle duration, and the number of repetitions.

In an embodiment, the first dielectric layer 232 is a layer of silicon nitride of about 4 nm, and the etching process 236 may include more than four repetitions of an etching cycle and a deposition cycle in a cyclic manner. During the etching cycle, the etchant gas may include a fluorine-containing chemical such as $CF_4$ or $CH_3F$. The etching cycle may additionally use oxygen as an etching promoter. For example, it may use $CH_3F$ gas and oxygen gas together. During the deposition cycle, a deposition gas containing carbon and hydrogen, such as $CH_4$, may be used. Each of the etching cycles and the deposition cycles may run for about 10 seconds to 20 seconds and the above etching and deposition gases may be introduced at a flow rate of about 15 to 25 standard cubic centimeters per minute (SCCM). The process pressure may be kept at about 20 mTorr to about 60 mTorr. In this embodiment, when the etching process 236 finishes, T2 is greater than T1, for example, by 1 to 2 nm.

In an embodiment, the etching process 236 includes a main etching process and an over etching process. For example, the main etching process may be used for breaking through, and removing the majority of, the horizontal portion of the first dielectric layer 236. This may be particularly effective in the logic device region. The over etching process may be used for removing any remaining of the horizontal portion of the first dielectric layer 236, particularly in the memory device region. The main etching process may use a lower pressure, higher bias voltage, and stronger etchant gases than the over etching process. The main etching process may run for shorter duration than the over etching process. For example, the main etching process may run for about 10 to 12 seconds, while the over etching process may run 60 seconds or longer. In an embodiment, the above cyclic process is implemented in the over etching process for fine tuning the thicknesses T1 and T2.

Figure 8:
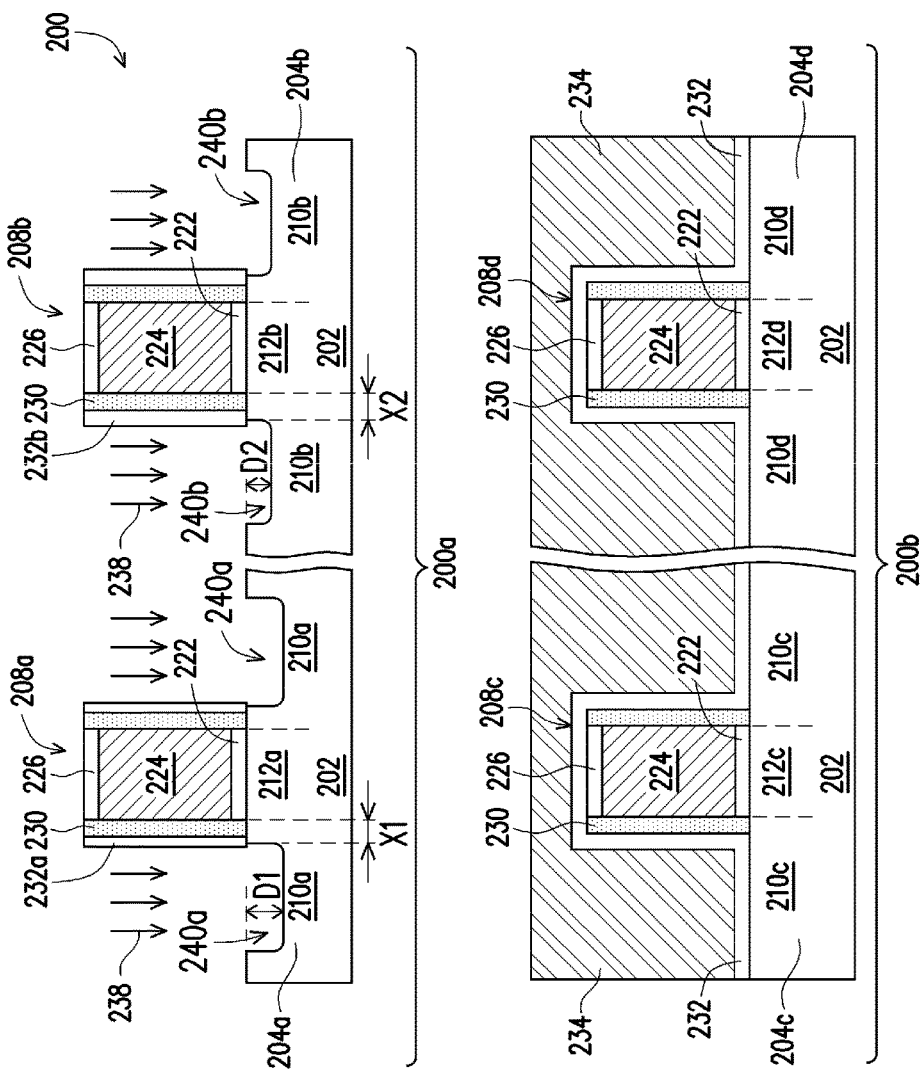

At operation 114, the method 100 (FIG. 1B) etches the substrate 202, particularly the fin active regions 204a-b, adjacent the gate structures 208a-b. Referring to FIG. 8, the operation 114 performs an etching process 238 thereby forming recesses 240a and 240b adjacent the gate structures 208a and 208b, respectively. The etching process 238 may be a dry etching process, a wet etching process, or other suitable etching processes. Due to a relatively larger device pitch in the logic device region than in the memory device region, relatively more etchant reaches the fin active regions 204a than the fin active region 204b. Consequently, the recesses 240a are etched deeper than the recesses 240b. In another word, a depth D1 of the recesses 240a is greater than a depth D2 of the recesses 240b. The layers 232a-b further contribute to the difference in the depths of the recesses 240a-b because the thicker layer 232b further limits the amount of etchant reaching the fin active region 204b. In various embodiments, the etching process 238 may be tuned (with the help of the device pitches P1 and P2 and the thicknesses T1 and T2) to produce the depth D1 in a range from about 50 to about 60 nm and the depth D2 in a range from about 35 to about 45 nm. In the present embodiment, D1 is greater than D2 by at least 15 nm to create sufficient depth loading for a subsequent epitaxial growth process.

In the present embodiment, the etching process 238 also laterally etches the fin active regions 204a-b such that the recesses 240a-b laterally expand under the first dielectric layers 232a-b, and even under the GSW spacers 230 in some embodiments. A proximity X1 is defined to be a horizontal distance from a vertical extension of the gate structure 208*a* to the nearest edge (or surface) of the recess 240*a*. A proximity X2 is defined to be a horizontal distance from a vertical extension of the gate structure 208*b* to the nearest edge (or surface) of the recess 240*b*. In the present embodiment, X2 is greater than X1. For example, X2 may range from about 5 nm to about 8 nm while X1 may range from about 3 nm to about 6 nm. The difference between X1 and X2 is a result of different device pitches P2 and P1, different thicknesses T1 and T2 of the first dielectric layer 232, among other factors.

Figure 9:
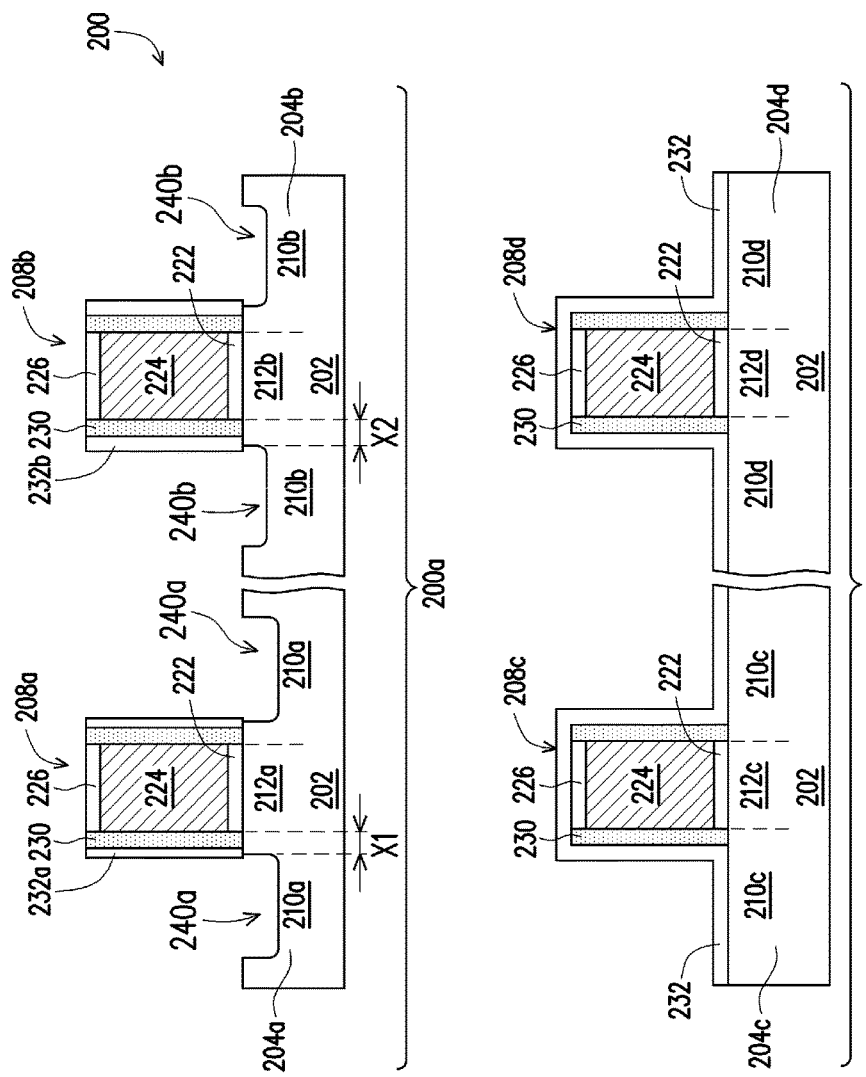

At operation 116, the method 100 (FIG. 1B) removes the masking element 234 from the device region 200*b* (FIG. 9). In an embodiment, the masking element 234 is a patterned resist and may be removed by a resist stripping process or a plasma ashing process. The removal of the masking element 234 is desirable for preventing contamination in a subsequent epitaxial growth process (such as operation 118 to be discussed). Operation 116 may subsequently perform a cleaning process to clean the recesses 240*a-b*.

Figure 10A:
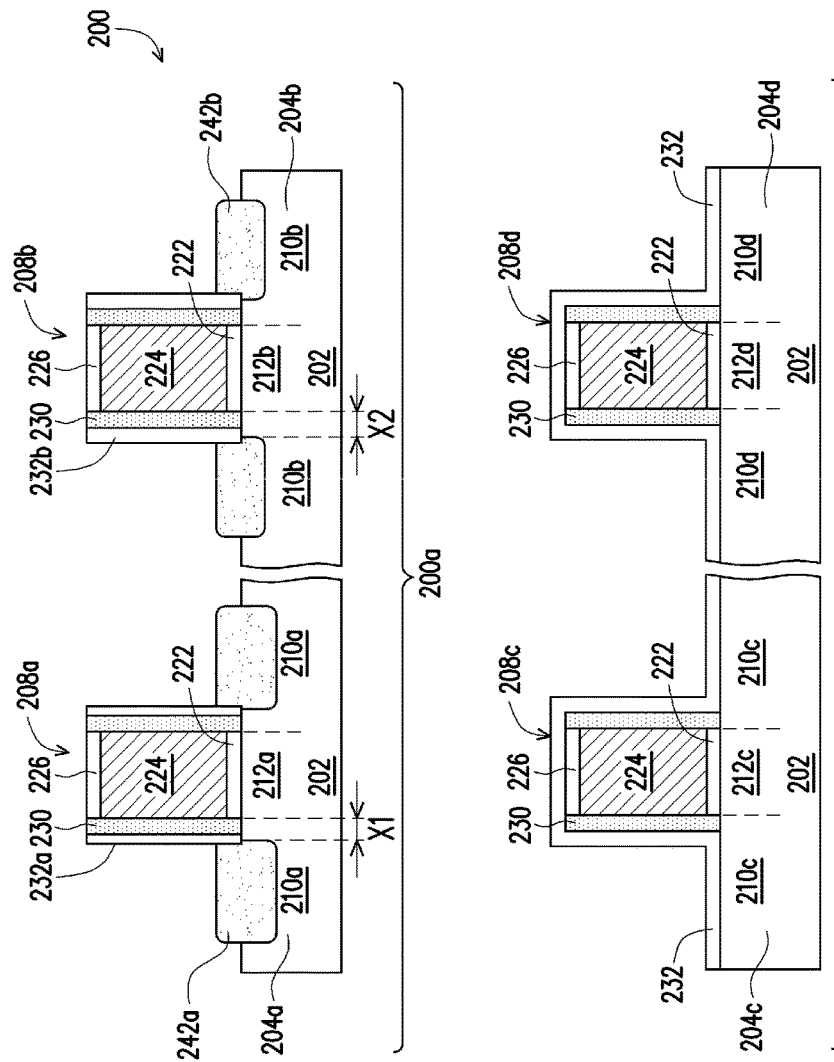
Figure 10B:
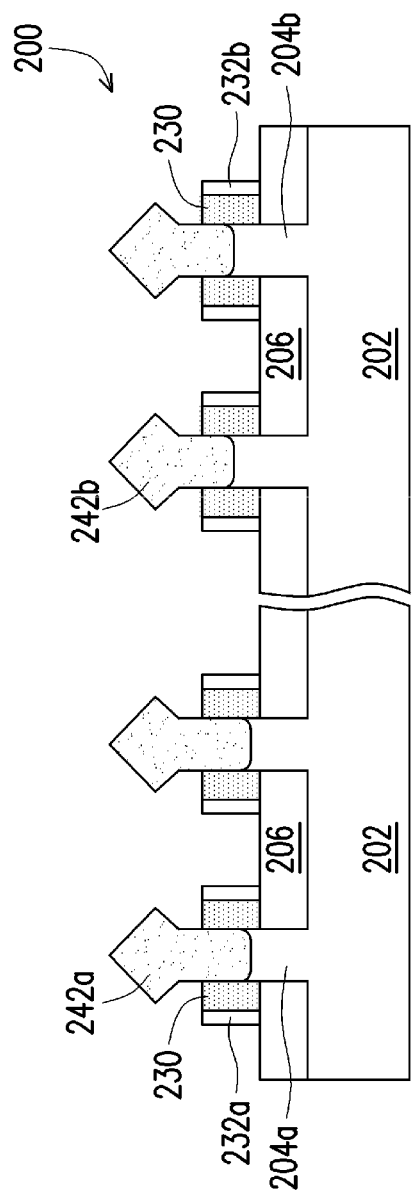

At operation 118, the method 100 (FIG. 1B) epitaxially grows source and drain (S/D) features 242*a* and 242*b* in the recesses 240*a* and 240*b* respectively. Referring to FIGS. 10A and 10B, the S/D features 242*a-b* fill the recesses 240*a-b* and further grow above a top surface of the fin active regions 204*a-b*. In the present embodiment, the S/D features 242*a-b* are further raised above a top surface of the gate dielectric layer 222. The raised S/D features 242*a-b* provide stress to the channel region 212*a-b* for improved device performance. Further, the S/D features 242*a* are deeper and have a greater volume than the S/D features 242*b*, which provides a relatively greater stress to the channel region 212*a*. At the same time, two adjacent S/D features 242*b* are properly separated from each other (FIG. 10B). Thus, operation 118 satisfies requirements for both logic devices and memory devices simultaneously. One explanation for this phenomenon is as follows. Since the recesses 240*b* are relatively shallower and smaller, the silicon areas for epitaxial growth are relatively smaller. Therefore, the growth rate of the epitaxial features 242*b* is relatively slower than the epitaxial features 242*a*, and when the epitaxial features 242*a* are properly raised, the epitaxial features 242*b* still stay separated.

In an embodiment, the epitaxial growth process is a low pressure chemical vapor deposition (LPCVD) process using a silicon-based precursor gas. Further, in the present example, the epitaxial growth process in-situ dopes the grown S/D features 242*a-b* with an n-type dopant such as P, As, or combinations thereof for forming the source/drain features for NFETs or a p-type dopant such as B for forming the source/drain features for PFETs. In some examples, for PFETs, the S/D features 242*a-b* include silicon germanium, germanium or a combination. For NFETs, the S/D features 242*a-b* include silicon carbon, silicon or a combination.

Figure 11:
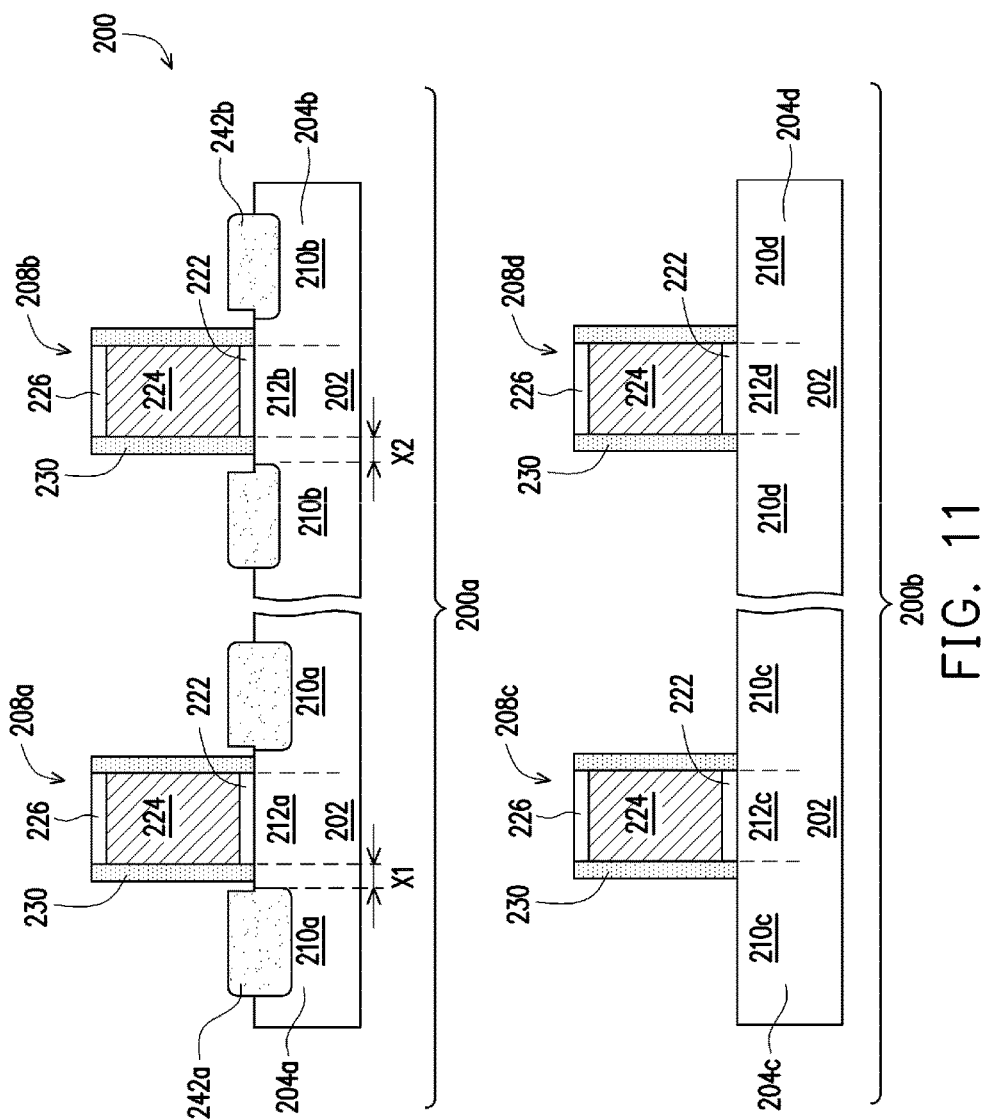

At operation 120, the method 100 (FIG. 1B) removes the first dielectric layer 232 from the semiconductor structure 200 using a selective etching process. In an embodiment, the first dielectric layer 232 includes silicon nitride and operation 120 may use a chemical containing $H_3PO_4$ to remove the first dielectric layer 232 while keeping various other structures substantially intact, as shown in FIG. 11.

Figure 12:
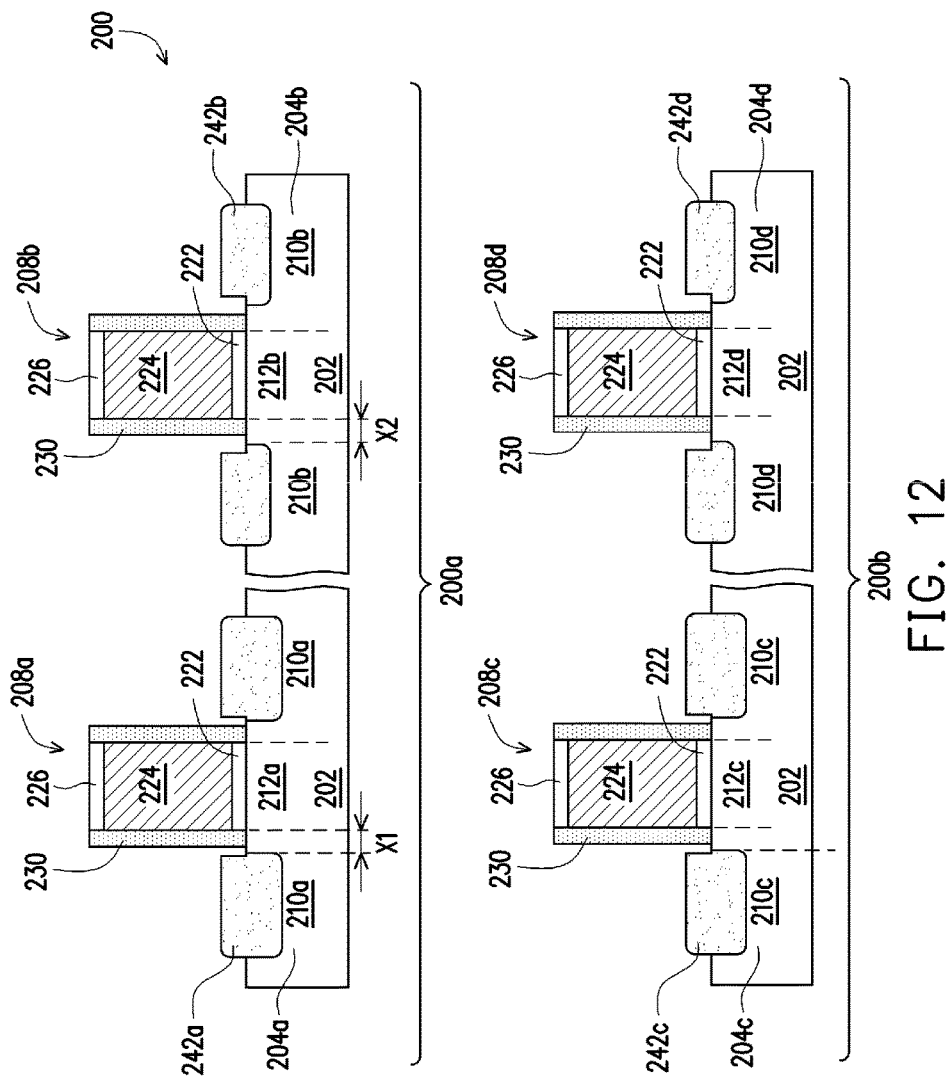

At operation 122, the method 100 (FIG. 1B) may perform steps similar to operations 108, 110, 112, 114, 116, and 118 as discussed above to form S/D features 242*c* and 242*d* adjacent the gate structures 208*c* and 208*d* respectively as shown in FIG. 12. For example, it may deposit a second dielectric layer covering the semiconductor structure 200 including the substrate 202 and the gate structures 208*a-d*. The second dielectric layer may use a material similar to the first dielectric layer 232, such as silicon nitride. Then operation 122 forms a second masking element over the second dielectric layer in the first region 200*a* and performs a second etching process to the second dielectric layer in the second region 200*b*. The second etching process may be similar to the first etching process 236. For example, the second etching process may include a cyclic process having repetitions of an etching cycle and a deposition cycle as discussed above. The second etching process results in a thicker portion of the second dielectric layer on the sidewalls of the gate structures 208*d* than on the sidewalls of the gate structures 208*c* due to the pitches P3 being greater than P4. Then, operation 122 etches the substrate 202 adjacent the gate structures 208*c-d* to form recesses. The recesses are deeper adjacent the gate structures 208*c* than adjacent the gate structures 208*d*. Also, the recesses are closer to the gate structures 208*c* than to the gate structures 208*d*. Next, operation 122 removes the second masking element and epitaxially grows the S/D features 242*c-d* in the recesses, as shown in FIG. 12.

Figure 13:
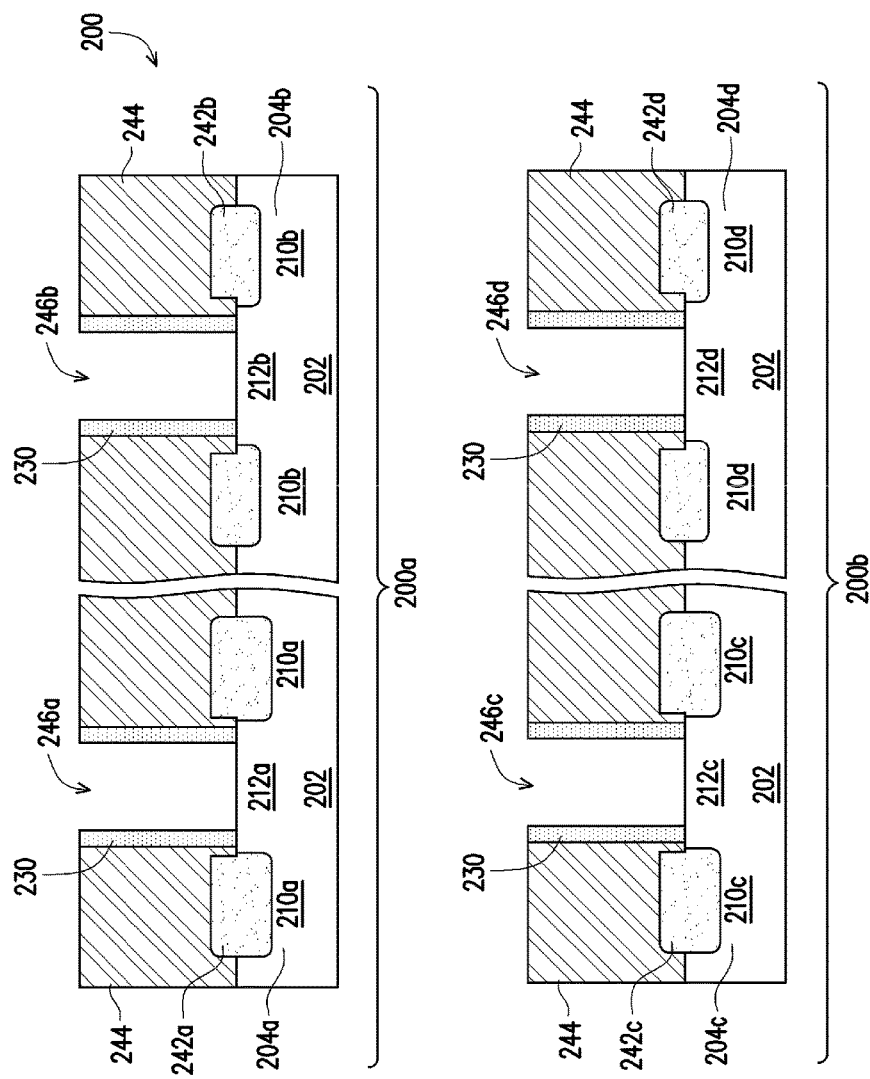
Figure 14:
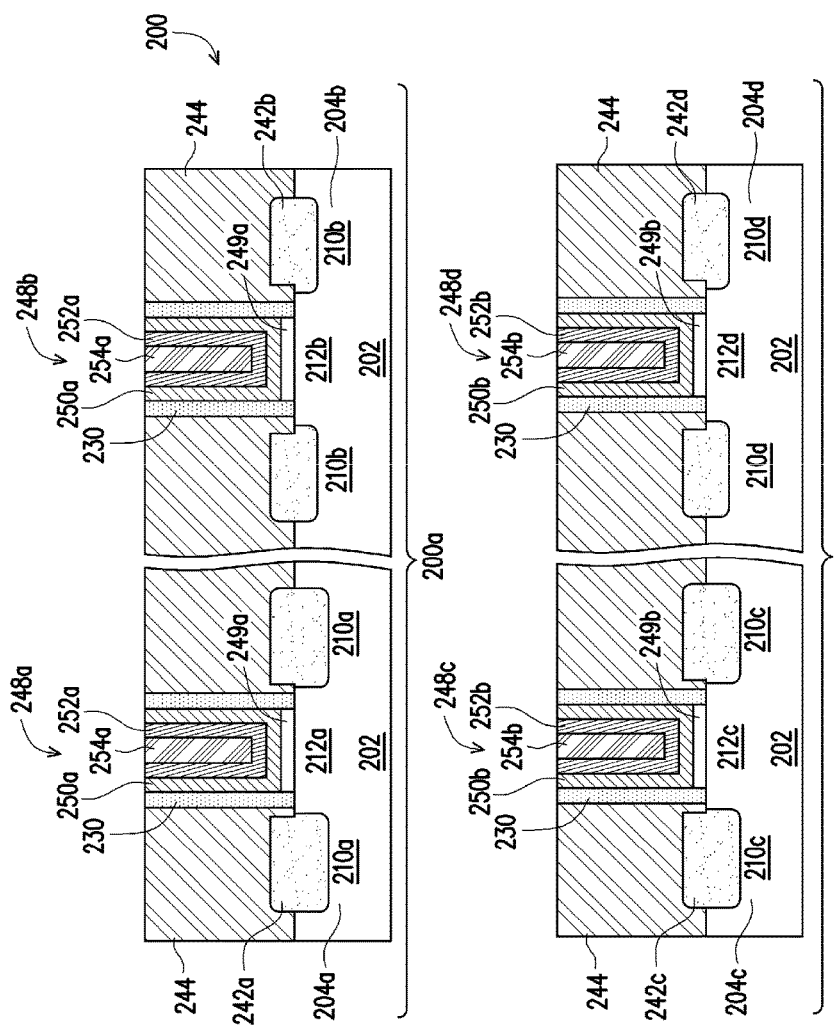

At operation 124, the method 100 (FIG. 1B) performs further steps to fabricate a final IC device. In an embodiment, the method 100 replaces the gate structure 208*a-d* with high-k metal gate stacks. Referring to FIG. 13, an inter-layer dielectric (ILD) layer 244 is formed over substrate 202 by a procedure, such as deposition and CMP. In an embodiment, the ILD layer 244 is formed by a flowable CVD (FCVD) process. The FCVD process includes depositing a flowable material (such as a liquid compound) on the substrate 202 to fill the gaps between the various structures and converting the flowable material to a solid material by a suitable technique, such as annealing in one example. Then, a CMP process is performed to the ILD layer 244 to expose the gate structures 208*a-d*. Subsequently, the gate structures 208*a-d* are removed by one or more selective etching processes thereby forming first openings 246*a*, 246*b*, 246*c*, and 246*d* in the regions 200*a* and 200*b*. The spacers 230 remain during the etch processes. The openings 246*a-d* are at least partially surrounded by the corresponding spacers 230. Referring to FIG. 14, one or more material layers are deposited into the openings 246*a-d* to form high-k metal gates 248*a*, 248*b*, 248*c*, and 248*d* respectively. In various embodiments, the replacing of the gate structures 208*a-b* is performed separately from the replacing of the gate structures 208*c-d* to enable separate n-type and p-type device tuning.

In the example shown in FIG. 14, the final gate stacks 248*a-b* and 248*c-d* include interfacial layers 249*a* and 249*b*, dielectric layers 250*a* and 250*b*, work function metal layers 252*a* and 252*b*, and fill layers 254*a* and 254*b*, respectively. The interfacial layers 249*a-b* may include a dielectric material such as silicon oxide or silicon oxynitride, and may be formed by chemical oxidation, thermal oxidation, ALD, CVD, and/or other suitable dielectric. The dielectric layer 250*a-b* may include a high-k dielectric layer such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof. The dielectric layers 250*a-b* may be formed by ALD and/or other suitable methods. The work function metal layers 252*a-b* may be an n-type work function layer for NFETs or a p-type work function layer for PFETs, and may be deposited by CVD, PVD, and/or other suitable process. The p-type work function layer comprises a metal with a sufficiently large effective work function, selected from but not limited to the group of titanium nitride (TiN), tantalum nitride (TaN), ruthenium (Ru), molybdenum (Mo), tungsten (W), platinum (Pt), or combinations thereof. The n-type work function layer comprises a metal with sufficiently low effective work function, selected from but not limited to the group of titanium (Ti), aluminum (Al), tantalum carbide (TaC), tantalum carbide nitride (TaCN), tantalum silicon nitride (TaSiN), or combinations thereof. The fill layers 254a-b may include aluminum (Al), tungsten (W), or copper (Cu) and/or other suitable materials, and may be formed by CVD, PVD, plating, and/or other suitable processes. A CMP process may be performed to remove excess materials from the gate stacks 248a-d and to planarize a top surface of the semiconductor structure 200. Further processes, such as contact and via formation, interconnect processing, etc., may be performed subsequently to complete the fabrication of the semiconductor structure 200.

Figure 15:
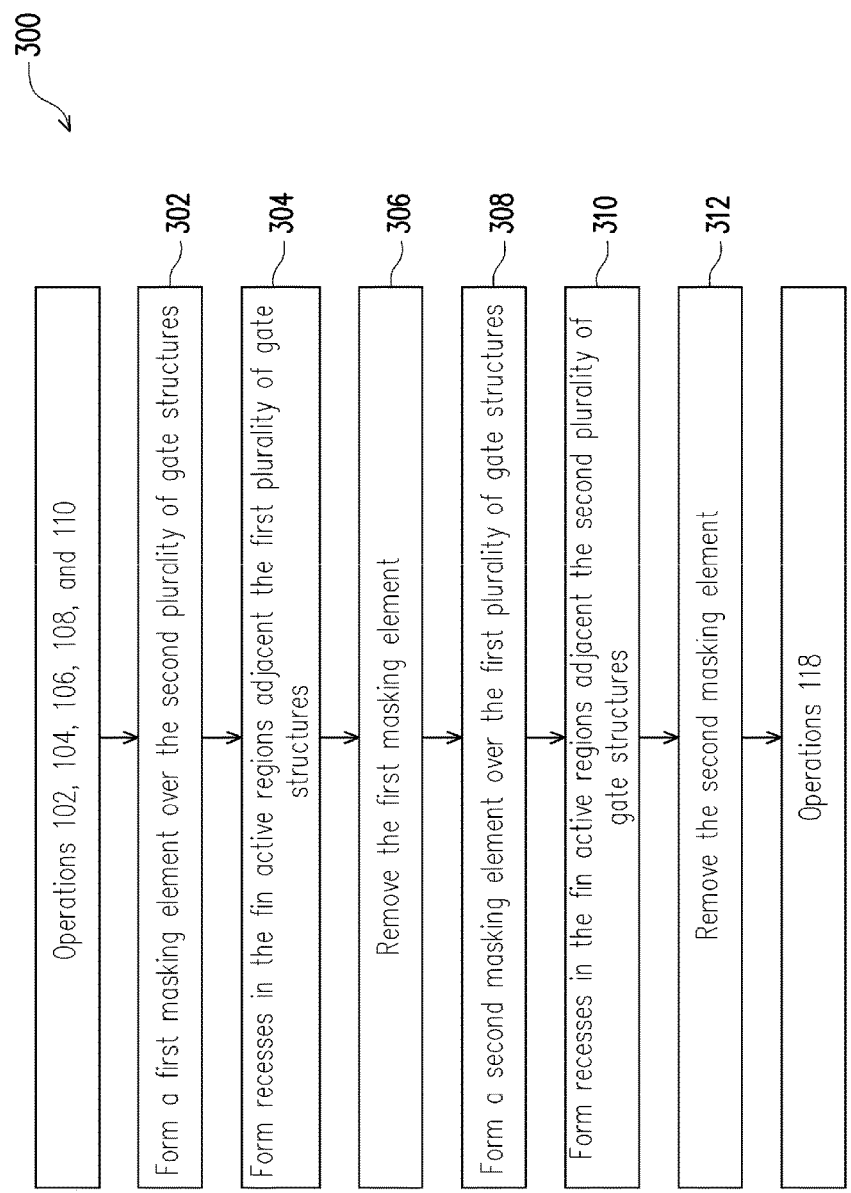
FIG. 15 shows a block diagram of another method of forming a semiconductor device, according to various aspects of the present disclosure.

Referring to FIG. 15, shown therein is a method 300 of forming the semiconductor structure 200 according to various aspects of the present disclosure in some other embodiments. The method 300 is an example, and is not intended to limit the present disclosure beyond what is explicitly recited in the claims. Additional operations can be provided before, during, and after the method 300, and some operations described can be replaced, eliminated, or moved around for additional embodiments of the method. The method 300 is described below in conjunction with FIGS. 16-17 which show cross-sectional views of the semiconductor structure 200 according to various aspects of the present disclosure.

Figure 16:
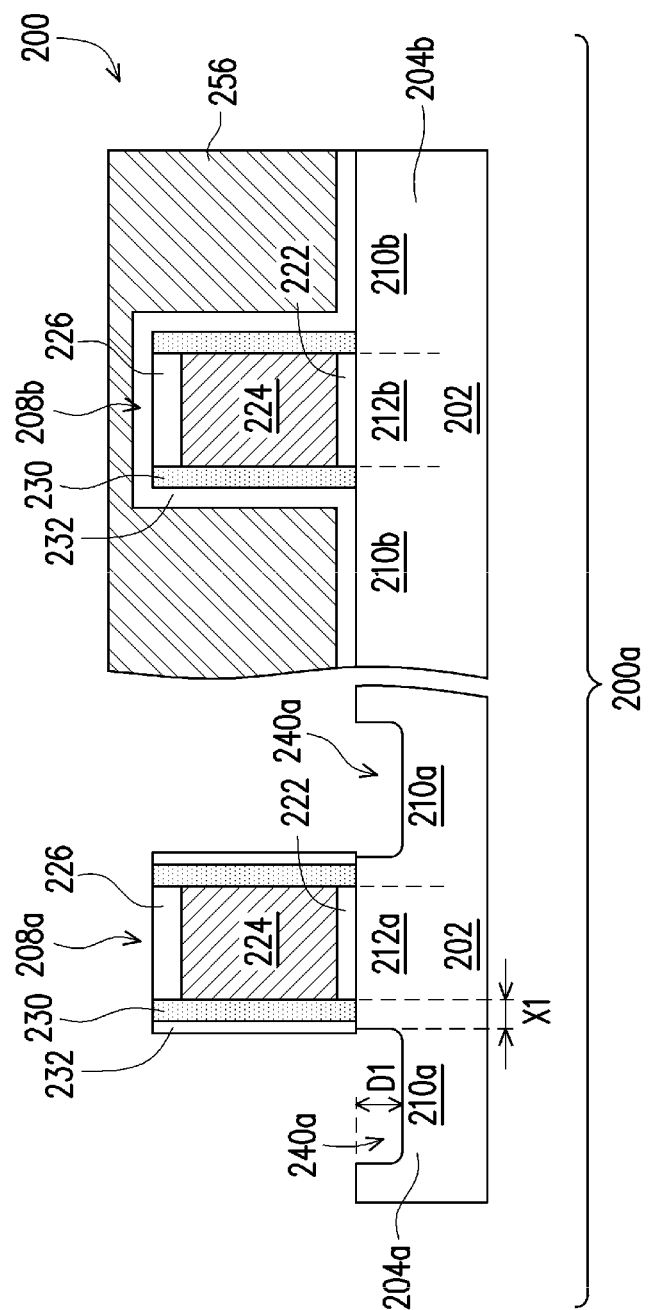
FIGS. 16 and 17 illustrate cross-sectional views of the semiconductor structure of FIG. 2A, in portion, at various fabrication stages according to the method of FIG. 15, in accordance with some embodiments.
Figure 17:
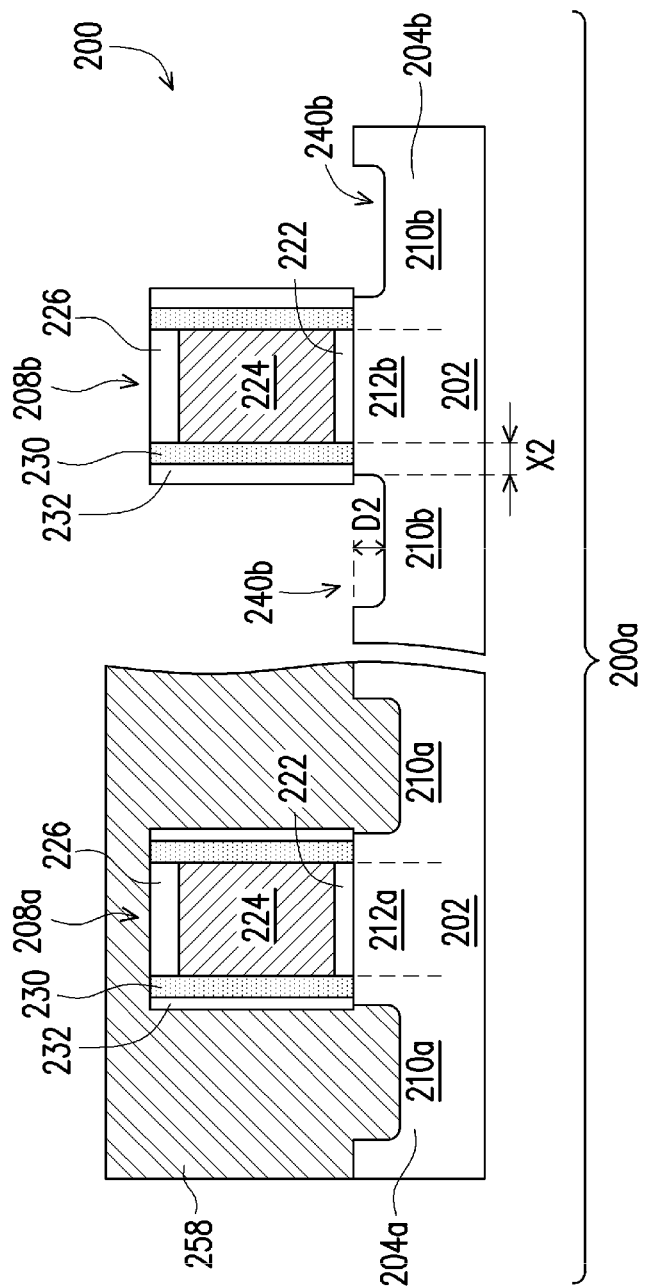

The method 300 is similar to the method 100 in many respects but differs from the method 100 in the etching of the first dielectric layer 232 and the substrate 202. Referring to FIG. 15, the method 300 also includes the operations 102, 104, 106, 108, and 110 as discussed above. From operation 110, the method 300 proceeds to operation 302 to form a first masking element 256 covering the substrate 202 and the gate structures 208b in the memory device region as shown in FIG. 16. The first masking element 256 is a patterned resist in an embodiment. Then, the method 300 proceeds to operation 304 to form recesses 240a adjacent the gate structures 208a. Operation 304 includes etching the first dielectric layer 232 and etching the substrate 202 in the logic device region. Since operation 304 only etches the logic device region, device density is no longer a concern for etch loading and the etching processes can be tuned to produce a desired profile in the recesses 240a, including a desired depth D1 and a desired proximity X1. Thereafter, the method 300 removes the first masking element 256 in operation 306 and forms a second masking element 258 covering the substrate 202 and the gate structures 208a in the logic device region as shown in FIG. 17. Then, the method 300 proceeds to operation 310 to form recesses 240b adjacent the gate structures 208b. Operation 310 includes etching the first dielectric layer 232 and etching the substrate 202 in the memory device region. Since operation 310 only etches the memory device region, device density is no longer a concern for etch loading and the etching processes can be tuned to produce a desired profile in the recesses 240b, including a desired depth D2 and a desired proximity X2. In the present embodiment, the etching processes are controlled such that D1 is greater than D2 and X2 is greater than X1. Thereafter, the method 300 removes the second masking element 258 in operation 312 and proceeds to operation 118, as discussed above.

Although not intended to be limiting, one or more embodiments of the present disclosure provide many benefits to a semiconductor device and the formation thereof. For example, embodiments of the present disclosure provide methods of forming raised epitaxial S/D features for both logic devices and memory devices simultaneously while fulfilling different requirements for the two types of devices. For example, the S/D features in the logic devices have a large volume so as to stress or strain the devices' channel regions for improved carrier mobility while the S/D features in the memory devices may remain separate between adjacent S/D features to avoid unintended circuit shorts. Embodiments of the present disclosure provide the above differences by creating different S/D recess profiles in the two types of devices. A further embodiment creates the different S/D recess profiles using one etching process for the two types of devices rather than separate etching processes. This improves production efficiency.

In one exemplary aspect, the present disclosure is directed to a method of forming a semiconductor structure. The method includes receiving a precursor having a substrate and first and second pluralities of gate structures over the substrate, the first pluralities having a greater pitch than the second pluralities. The method further includes depositing a first dielectric layer covering the substrate and the first and second pluralities; and performing a first etching process to the first dielectric layer. The first etching process removes a first portion of the first dielectric layer over the substrate, while a second portion of the first dielectric layer remains over sidewalls of the first and second pluralities. The second portion of the first dielectric layer is thicker over the sidewalls of the second plurality than over the sidewalls of the first plurality. The method further includes etching the substrate to form third and fourth pluralities of recesses adjacent the first and second pluralities, respectively; and epitaxially growing fifth and sixth pluralities of semiconductor features in the third and fourth pluralities, respectively.

In another exemplary aspect, the present disclosure is directed to a method of forming a semiconductor structure. The method includes receiving a precursor having first and second regions and a substrate extending in the first and second regions. The precursor further has first and second pluralities of gate structures over the substrate in the first region. The first pluralities having a greater pitch than the second pluralities. The precursor further has third and fourth pluralities of gate structures over the substrate in the second region. The third pluralities having a greater pitch than the fourth pluralities. The method further includes depositing a first dielectric layer covering the substrate and the first, second, third, and fourth pluralities; and forming a masking element over the first dielectric layer in the second region. The method further includes performing a first etching process to the first dielectric layer in the first region to expose the substrate, wherein a portion of the first dielectric layer remains over sidewalls of the first and second pluralities. The portion of the first dielectric layer is thicker over the sidewalls of the second plurality than over the sidewalls of the first plurality. The method further includes etching the substrate to form fifth and sixth pluralities of recesses adjacent the first and second pluralities; and epitaxially growing source and drain features in the fifth and sixth pluralities, respectively, using a first semiconductor material.

In yet another exemplary aspect, the present disclosure is directed to a semiconductor structure. The semiconductor structure includes a substrate having fin active regions; and first and second pluralities of gate structures over the substrate and engaging the fin active regions. The first pluralities have a greater pitch than the second pluralities. The semiconductor structure further includes third and fourth pluralities of recesses into the fin active regions proximate the first and second pluralities, respectively. A first proximity of the third pluralities to the respective first pluralities is smaller than a second proximity of the fourth pluralities to the respective second pluralities. The semiconductor structure further includes fifth and sixth pluralities of semiconductor features in the third and fourth pluralities, respectively, and raised above a top surface of the fin active regions.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a substrate;
    at least three first gate structures separate one from another and adjacent to each other and at least three second gate structures separate one from another and adjacent to each other over the substrate, the first gate structures having a greater pitch than the second gate structures;
    third epitaxial semiconductor features proximate the first gate structures; and
    fourth epitaxial semiconductor features proximate the second gate structures, wherein the third and fourth epitaxial semiconductor features are at least partially embedded in the substrate, wherein a first proximity of the third epitaxial semiconductor features to the respective first gate structures is smaller than a second proximity of the fourth epitaxial semiconductor features to the respective second gate structures.

2. The semiconductor structure of claim 1, wherein the third and fourth epitaxial semiconductor features are raised above a top surface of the substrate.

3. The semiconductor structure of claim 1, wherein the third and fourth epitaxial semiconductor features include n-type doped silicon or p-type doped silicon germanium.

4. The semiconductor structure of claim 1, wherein the first proximity ranges from 3 to 6 nm, and the second proximity ranges from 5 to 8 nm.

5. The semiconductor structure of claim 1, wherein the third epitaxial semiconductor features are source and drain (S/D) features of logic devices and the fourth epitaxial semiconductor features are S/D features of memory devices.

6. The semiconductor structure of claim 1, wherein a first depth of the third epitaxial semiconductor features embedded into the substrate is greater than a second depth of the fourth epitaxial semiconductor features embedded into the substrate.

7. The semiconductor structure of claim 6, wherein the first depth is greater than the second depth by at least 15 nm.

8. The semiconductor structure of claim 1, wherein the substrate includes fins, the first and second gate structures are disposed over the fins, and the third and fourth epitaxial semiconductor features are at least partially embedded in the fins.

9. The semiconductor structure of claim 8, wherein the fins under the first gate structures have a greater fin pitch than the fins under the second gate structures.

10. The semiconductor structure of claim 1, further comprising spacers on sidewalls of the first and second gate structures.

11. The semiconductor structure of claim 10, wherein a first lateral distance between the third epitaxial semiconductor features and the spacers on the sidewalls of the respective first gate structures is smaller than a second lateral distance between the fourth epitaxial semiconductor features and the spacers on the sidewalls of the respective second gate structures.

12. The semiconductor structure of claim 10, further comprising a dielectric material covering the third and fourth epitaxial semiconductor features, filling in space between the third epitaxial semiconductor features and the respective first gate structures, and filling in space between the fourth epitaxial semiconductor features and the respective second gate structures.

13. A semiconductor structure, comprising:
    a substrate;
    fins extending from the substrate;
    first gate structures and second gate structures over the substrate and engaging the fins, the first gate structures having a greater pitch than the second gate structures;
    third epitaxial semiconductor features adjacent the first gate structures; and
    fourth epitaxial semiconductor features adjacent the second gate structures, wherein the third and fourth epitaxial semiconductor features are partially embedded in the fins and raised above a top surface of the fins, wherein a first depth of the third epitaxial semiconductor features embedded into the fins is greater than a second depth of the fourth epitaxial semiconductor features embedded into the fins.

14. The semiconductor structure of claim 13, wherein a first proximity of the third epitaxial semiconductor features to the respective first gate structures is smaller than a second proximity of the fourth epitaxial semiconductor features to the respective second gate structures.

15. The semiconductor structure of claim 14, wherein the first depth ranges from 50 to 60 nm, and the second depth ranges from 35 to 45 nm.

16. The semiconductor structure of claim 15, wherein the first proximity ranges from 3 to 6 nm, and the second proximity ranges from 5 to 8 nm.

17. The semiconductor structure of claim 13, further comprising gate spacers on sidewalls of the first and second gate structures, wherein the gate spacers are spaced from the third and fourth epitaxial semiconductor features by a dielectric material.

18. A method, comprising:
    receiving a structure having a substrate, fins extending from the substrate, and first and second pluralities of gate structures engaging the fins, the first plurality of gate structures having a larger pitch than the second plurality of gate structures;
    forming gate spacers on sidewalls of the first and second pluralities of gate structures;
    depositing a first dielectric layer over the substrate, the fins, the first and second pluralities of gate structures, and the gate spacers;

etching the first dielectric layer to remove the first dielectric layer except that a portion of the first dielectric layer is kept over sidewalls of the first and second pluralities of gate structures, wherein the portion of the first dielectric layer is thicker over the sidewalls of the second plurality of gate structures than over the sidewalls of the first plurality of gate structures;

after the etching of the first dielectric layer, etching the fins to form third and fourth pluralities of recesses adjacent the first and second pluralities of gate structures, respectively, wherein the third plurality of recesses is deeper than the fourth plurality of recesses; and epitaxially growing fifth and sixth pluralities of semiconductor features in the third and fourth pluralities of recesses, respectively.

19. The method of claim 18, wherein the etching of the first dielectric layer includes a cyclic etching and deposition process that includes etching with a gas containing fluorine, chlorine, oxygen, bromine, or iodine and depositing with another gas containing carbon.

20. The method of claim 19, wherein the first dielectric layer includes silicon nitride or silicon oxynitride.

\* \* \* \* \*